United States Patent
Matsubayashi

(10) Patent No.: US 9,627,386 B2
(45) Date of Patent: Apr. 18, 2017

(54) MEMORY DEVICE AND ELECTRONIC DEVICE

(71) Applicant: Semiconductor Energy Laboratory Co., Ltd., Atsugi-shi, Kanagawa-ken (JP)

(72) Inventor: Daisuke Matsubayashi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/193,189

(22) Filed: Jun. 27, 2016

(65) Prior Publication Data

US 2016/0307901 A1  Oct. 20, 2016

Related U.S. Application Data

(63) Continuation of application No. 14/297,668, filed on Jun. 6, 2014, now Pat. No. 9,385,128, which is a
(Continued)

(30) Foreign Application Priority Data

Mar. 18, 2011 (JP) ................................. 2011-060175

(51) Int. Cl.
   *G11C 8/00* (2006.01)
   *H01L 27/105* (2006.01)
   (Continued)

(52) U.S. Cl.
   CPC ............ *H01L 27/1052* (2013.01); *G11C 8/10* (2013.01); *G11C 11/404* (2013.01);
   (Continued)

(58) Field of Classification Search
   CPC . G11C 11/404; G11C 11/405; G11C 16/0408; G11C 11/565; G11C 16/0433;
   (Continued)

(56) References Cited

U.S. PATENT DOCUMENTS

| | | |
|---|---|---|
| 4,571,584 A | 2/1986 | Suzuki |
| 4,591,848 A | 5/1986 | Morozumi et al. |

(Continued)

FOREIGN PATENT DOCUMENTS

| | | |
|---|---|---|
| CN | 001656618 A | 8/2005 |
| CN | 001998087 A | 7/2007 |

(Continued)

OTHER PUBLICATIONS

Asakuma.N et al., "Crystallization and Reduction of Sol-Gel-Derived Zinc Oxide Films by Irradiation with Ultraviolet Lamp", Journal of Sol-Gel Science and Technology, 2003, vol. 26, pp. 181-184.

(Continued)

*Primary Examiner* — Thong Q Le
(74) *Attorney, Agent, or Firm* — Fish & Richardson P.C.

(57) ABSTRACT

A selection operation is performed for individual memory cells. A device includes a first memory cell and a second memory cell provided in the same row as the first memory cell, each of which includes a field-effect transistor having a first gate and a second gate. The field-effect transistor controls at least data writing and data holding in the memory cell by being turned on or off. The device further includes a row selection line electrically connected to the first gates of the field-effect transistors included in the first memory cell and the second memory cell, a first column selection line electrically connected to the second gate of the field-effect transistor included in the first memory cell, and a second column selection line electrically connected to the second (Continued)

gate of the field-effect transistor included in the second memory cell.

16 Claims, 17 Drawing Sheets

Related U.S. Application Data continuation of application No. 13/418,546, filed on Mar. 13, 2012, now Pat. No. 8,760,959.

(51) Int. Cl.

| | |
|---|---|
| *H01L 27/06* | (2006.01) |
| *H01L 27/1156* | (2017.01) |
| *H01L 27/12* | (2006.01) |
| *G11C 8/10* | (2006.01) |
| *G11C 11/404* | (2006.01) |
| *G11C 11/405* | (2006.01) |
| *H01L 23/528* | (2006.01) |
| *H01L 29/786* | (2006.01) |

(52) U.S. Cl.
CPC .......... *G11C 11/405* (2013.01); *H01L 23/528* (2013.01); *H01L 27/0629* (2013.01); *H01L 27/0688* (2013.01); *H01L 27/105* (2013.01); *H01L 27/1156* (2013.01); *H01L 27/1225* (2013.01); *H01L 29/7869* (2013.01)

(58) Field of Classification Search
CPC ..... G11C 16/10; G11C 11/4091; G11C 16/08; G11C 16/24; G11C 11/4074; G11C 11/4094; G11C 11/5628; G11C 16/12
USPC .. 365/149, 104, 145, 185.1, 185.14, 185.18, 365/185.26, 230.03, 231, 45, 63, 72
See application file for complete search history.

(56) References Cited

U.S. PATENT DOCUMENTS

| | | | |
|---|---|---|---|
| 4,769,639 A | 9/1988 | Kawamura et al. | |
| 4,922,240 A | 5/1990 | Duwaer | |
| 5,132,819 A | 7/1992 | Noriyama et al. | |
| 5,159,260 A | 10/1992 | Yoh et al. | |
| 5,250,931 A | 10/1993 | Misawa et al. | |
| 5,365,250 A | 11/1994 | Hirashima | |
| 5,428,238 A | 6/1995 | Hayashi et al. | |
| 5,457,474 A | 10/1995 | Ikeda | |
| 5,477,073 A | 12/1995 | Wakai et al. | |
| 5,506,436 A | 4/1996 | Hayashi et al. | |
| 5,559,526 A | 9/1996 | Izawa | |
| 5,567,959 A | 10/1996 | Mineji | |
| 5,570,105 A | 10/1996 | Koyama | |
| 5,574,474 A | 11/1996 | Tamanoi | |
| 5,574,475 A | 11/1996 | Callahan et al. | |
| 5,576,571 A | 11/1996 | Hayashi et al. | |
| 5,578,852 A | 11/1996 | Hayashi et al. | |
| 5,578,853 A | 11/1996 | Hayashi et al. | |
| 5,581,106 A | 12/1996 | Hayashi et al. | |
| 5,644,147 A | 7/1997 | Yamazaki et al. | |
| 5,646,643 A | 7/1997 | Hirai et al. | |
| 5,663,918 A | 9/1997 | Javanifard et al. | |
| 5,666,133 A | 9/1997 | Matsuo et al. | |
| 5,680,149 A | 10/1997 | Koyama et al. | |
| 5,689,280 A | 11/1997 | Asari et al. | |
| 5,712,652 A | 1/1998 | Sato et al. | |
| 5,731,856 A | 3/1998 | Kim et al. | |
| 5,744,864 A | 4/1998 | Cillessen et al. | |
| 5,807,772 A | 9/1998 | Takemura | |
| 5,808,595 A | 9/1998 | Kubota et al. | |
| 5,814,834 A | 9/1998 | Yamazaki et al. | |
| 5,818,070 A | 10/1998 | Yamazaki et al. | |
| 5,821,137 A | 10/1998 | Wakai et al. | |
| 5,834,797 A | 11/1998 | Yamanaka | |
| 5,899,547 A | 5/1999 | Yamazaki et al. | |
| 5,917,199 A | 6/1999 | Byun et al. | |
| 5,917,221 A | 6/1999 | Takemura | |
| 5,929,527 A | 7/1999 | Yamazaki et al. | |
| 5,936,881 A | 8/1999 | Kawashima et al. | |
| 5,956,011 A | 9/1999 | Koyama et al. | |
| 6,010,923 A | 1/2000 | Jinno | |
| 6,037,924 A | 3/2000 | Koyama et al. | |
| 6,072,193 A | 6/2000 | Ohnuma et al. | |
| 6,081,131 A | 6/2000 | Ishii | |
| 6,150,283 A | 11/2000 | Ishiguro | |
| 6,153,893 A | 11/2000 | Inoue et al. | |
| 6,197,624 B1 | 3/2001 | Yamazaki | |
| 6,198,133 B1 | 3/2001 | Yamazaki et al. | |
| 6,204,519 B1 | 3/2001 | Yamazaki et al. | |
| 6,207,971 B1 | 3/2001 | Jinno et al. | |
| 6,215,154 B1 | 4/2001 | Ishida et al. | |
| 6,282,137 B1 | 8/2001 | Lee et al. | |
| 6,294,274 B1 | 9/2001 | Kawazoe et al. | |
| 6,314,017 B1 | 11/2001 | Emori et al. | |
| 6,380,011 B1 | 4/2002 | Yamazaki et al. | |
| 6,392,628 B1 | 5/2002 | Yamazaki et al. | |
| 6,396,078 B1 | 5/2002 | Uochi et al. | |
| 6,462,723 B1 | 10/2002 | Yamazaki et al. | |
| 6,512,271 B1 | 1/2003 | Yamazaki et al. | |
| 6,563,174 B2 | 5/2003 | Kawasaki et al. | |
| 6,569,716 B1 | 5/2003 | Suzuki | |
| 6,603,453 B2 | 8/2003 | Yamazaki et al. | |
| 6,608,613 B2 | 8/2003 | Koyama et al. | |
| 6,727,522 B1 | 4/2004 | Kawasaki et al. | |
| 6,960,787 B2 | 11/2005 | Yamazaki et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,189,992 B2 | 3/2007 | Wager, III et al. | |
| 7,202,863 B2 | 4/2007 | Kimura et al. | |
| 7,211,825 B2 | 5/2007 | Shih et al | |
| 7,247,882 B2 | 7/2007 | Yamazaki et al. | |
| 7,276,730 B2 | 10/2007 | Yamazaki et al. | |
| 7,282,782 B2 | 10/2007 | Hoffman et al. | |
| 7,286,383 B1 | 10/2007 | Poplevine et al. | |
| 7,297,977 B2 | 11/2007 | Hoffman et al. | |
| 7,323,356 B2 | 1/2008 | Hosono et al. | |
| 7,339,187 B2 | 3/2008 | Wager, III et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,710,765 B2 | 5/2010 | Hanafi | |
| 7,732,819 B2 | 6/2010 | Akimoto et al. | |
| 7,786,985 B2 | 8/2010 | Kimura et al. | |
| 7,859,510 B2 | 12/2010 | Umezaki | |
| 7,888,207 B2 | 2/2011 | Wager, III et al. | |
| 7,952,913 B2 | 5/2011 | Hanafi | |
| 8,044,906 B2 | 10/2011 | Kimura et al. | |
| 8,054,279 B2 | 11/2011 | Umezaki et al. | |
| 8,059,078 B2 | 11/2011 | Kimura et al. | |
| 8,194,469 B2 | 6/2012 | Tanaka et al. | |
| 9,472,559 B2* | 10/2016 | Shionoiri | H01L 27/115 |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager, III et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0158929 A1 | 7/2005 | Yamazaki et al. | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |

(56) References Cited

U.S. PATENT DOCUMENTS

| | | |
|---|---|---|
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102313 A1 | 4/2010 | Miyairi et al. |
| 2010/0102314 A1 | 4/2010 | Miyairi et al. |
| 2010/0109002 A1 | 5/2010 | Itagaki et al. |
| 2010/0117079 A1 | 5/2010 | Miyairi et al. |
| 2011/0089927 A1 | 4/2011 | Yamazaki et al. |
| 2011/0101352 A1 | 5/2011 | Hosono et al. |
| 2011/0102409 A1 | 5/2011 | Hayakawa |
| 2011/0156025 A1 | 6/2011 | Shionoiri et al. |
| 2011/0201162 A1 | 8/2011 | Hosono et al. |
| 2011/0204365 A1 | 8/2011 | Saito |
| 2011/0204475 A1 | 8/2011 | Rui et al. |
| 2012/0012838 A1 | 1/2012 | Hosono et al. |
| 2012/0014194 A1 | 1/2012 | Deng |
| 2012/0032943 A1 | 2/2012 | Kimura et al. |
| 2012/0049184 A1 | 3/2012 | Umezaki et al. |
| 2012/0051118 A1 | 3/2012 | Yamazaki et al. |
| 2012/0056860 A1 | 3/2012 | Umezaki et al. |
| 2012/0068173 A1 | 3/2012 | Umezaki |
| 2012/0161127 A1 | 6/2012 | Kato et al. |

FOREIGN PATENT DOCUMENTS

| | | |
|---|---|---|
| EP | 0601590 A | 6/1994 |
| EP | 0971360 A | 1/2000 |
| EP | 1737044 A | 12/2006 |
| EP | 2226847 A | 9/2010 |
| EP | 2246894 A | 11/2010 |
| EP | 2413366 A | 2/2012 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 01-128563 A | 5/1989 |
| JP | 01-154394 A | 6/1989 |
| JP | 05-251705 A | 9/1993 |
| JP | 07-099251 A | 4/1995 |
| JP | 07-176184 A | 7/1995 |
| JP | 07-211084 A | 8/1995 |
| JP | 08-264794 A | 10/1996 |
| JP | 11-126491 A | 5/1999 |
| JP | 11-505377 | 5/1999 |
| JP | 2000-044236 A | 2/2000 |
| JP | 2000-150900 A | 5/2000 |
| JP | 2001-093988 A | 4/2001 |
| JP | 2002-076356 A | 3/2002 |
| JP | 2002-198499 A | 7/2002 |
| JP | 2002-289859 A | 10/2002 |
| JP | 2003-078026 A | 3/2003 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-502597 | 1/2006 |
| JP | 2009-182194 A | 8/2009 |
| JP | 2009-259337 A | 11/2009 |
| TW | I278113 | 4/2007 |
| TW | 200937584 | 9/2009 |
| WO | WO-95/19625 | 7/1995 |
| WO | WO-2004/038757 | 5/2004 |
| WO | WO-2004/114391 | 12/2004 |
| WO | WO-2005/088726 | 9/2005 |
| WO | WO-2009/042029 | 4/2009 |
| WO | WO-2010/131310 | 11/2010 |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 365-398.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Cho.D et al., "21.2:Al and Sn-Doped Zinc Indium Oxide Thin Film Transistors for AMOLED Back Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

(56) References Cited

OTHER PUBLICATIONS

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Fortunato.E et al., "Wide-Bandgap High-Mobility ZnO Thin-Film Transistors Produced at Room Temperature", Appl. Phys. Lett. (Applied Physics Letter), Sep. 27, 2004, vol. 85, No. 13, pp. 2541-2543.
Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.
Godo.H et al., "P-9:Numerical Analysis on Temperature Dependence of Characteristics of Amorphous In—Ga—Zn-Oxide TFT", SID Digest '09: SID International Symposium of Technical Papers, May 31, 2009, pp. 1110-1112.
Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.
Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.
Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.
Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.
Ikeda.T et al., "Full-Functional System Liquid Crystal Display Using Cg-Silicon Technology", SID Digest '04 : SID International Symposium Digest of Technical Papers, 2004, vol. 35, pp. 860-863.
Janotti.A et al., "Native Point Defects in ZnO", Phys. Rev. B (Physical Review. B), Oct. 4, 2007, vol. 76, No. 16, pp. 165202-1-165202-22.
Janotti.A et al., "Oxygen Vacancies in ZnO", Appl. Phys. Lett. (Applied Physics Letters), 2005, vol. 87, pp. 122102-1-122102-3.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.
Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System", Journal of Solid State Chemistry, Apr. 1, 1995, vol. 116, No. 1, pp. 170-178.
Kitzerow.H et al., "Observation of Blue Phases in Chiral Networks", Liquid Crystals, 1993, vol. 14, No. 3, pp. 911-916.
Kurokawa.Y et al., "UHF RFCPUS on Flexible and Glass Substrates for Secure RFID Systems", Journal of Solid-State Circuits , 2008, vol. 43, No. 1, pp. 292-299.
Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.
Lee.H et al., "Current Status of, Challenges to, and Perspective View of AM-OLED", IDW '06 : Proceedings of the 13th International Display Workshops, Dec. 7, 2006, pp. 663-666.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Li.C et al., "Modulated Structures of Homologous Compounds InMO3(ZnO)m (M=In,Ga; m=Integer) Described by Four-Dimensional Superspace Group", Journal of Solid State Chemistry, 1998, vol. 139, pp. 347-355.
Masuda.S et al., "Transparent thin film transistors using ZnO as an active channel layer and their electrical properties", J. Appl. Phys. (Journal of Applied Physics) , Feb. 1, 2003, vol. 93, No. 3, pp. 1624-1630.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Miyasaka.M, "SUFTLA Flexible Microelectronics on Their Way to Business", SID Digest '07 : SID International Symposium Digest of Technical Papers, 2007, vol. 38, pp. 1673-1676.
Mo.Y et al., "Amorphous Oxide TFT Backplanes for Large Size AMOLED Displays", IDW '08 : Proceedings of the 6th International Display Workshops, Dec. 3, 2008, pp. 581-584.
Nakamura.M, "Synthesis of Homologous Compound with New Long-Period Structure", Nirim Newsletter, Mar. 1, 1995, vol. 150, pp. 1-4.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Nomura.K et al., "Amorphous Oxide Semiconductors for High-Performance Flexible Thin-Film Transistors", Jpn. J. Appl. Phys. (Japanese Journal of Applied Physics) , 2006, vol. 45, No. 5B, pp. 4303-4308.
Nomura.K et al., "Carrier transport in transparent oxide semiconductor with intrinsic structural randomness probed using single-crystalline InGaO3(ZnO)5 films", Appl. Phys. Lett. (Applied Physics Letters) , Sep. 13, 2004, vol. 85, No. 11, pp. 1993-1995.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Nomura.K et al., "Thin-Film Transistor Fabricated in Single-Crystalline Transparent Oxide Semiconductor", Science, May 23, 2003, vol. 300, No. 5623, pp. 1269-1272.
Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

(56) References Cited

OTHER PUBLICATIONS

Oba.F et al., "Defect energetics in ZnO: A hybrid Hartree-Fock density functional study", Phys. Rev. B.(Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Orita.M et al., "Amorphous transparent conductive oxide InGaO3(ZnO)m (m<4):a Zn4s conductor", Philosophical Magazine, 2001, vol. 81, No. 5, pp. 501-515.

Orita.M et al., "Mechanism of Electrical Conductivity of Transparent InGaZnO4", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.J et al., "Electronic Transport Properties of Amorphous Indium-Gallium-Zinc Oxide Semiconductor Upon Exposure to Water", Appl. Phys. Lett. (Applied Physics Letters) , 2008, vol. 92, pp. 072104-1-072104-3.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Improvements in the Device Characteristics of Amorphous Indium Gallium Zinc Oxide Thin-Film Transistors by Ar Plasma Treatment", Appl. Phys. Lett. (Applied Physics Letters) , Jun. 26, 2007, vol. 90, No. 26, pp. 262106-1-262106-3.

Park.S et al., "Challenge to Future Displays: Transparent AM-OLED Driven by PEALD Grown ZnO TFT", IMID '07 Digest, 2007, pp. 1249-1252.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters) , Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs", IDW '02 : Proceedings of the 9th International Display Workshops, Dec. 4, 2002, pp. 295-298.

Ueno.K et al., "Field-Effect Transistor on SrTiO3 With Sputtered Al2O3 Gate Insulator", Appl. Phys. Lett. (Applied Physics Letters) , Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Taiwanese Office Action (Application No. 101108624) Dated Nov. 20, 2015.

Chinese Office Action (Application No. 201210082547.1) Dated Nov. 26, 2015.

Taiwanese Office Action (Application No. 105111848) Dated Jan. 17, 2017.

\* cited by examiner

| | | Writing | Reading |
|---|---|---|---|
| 202_M | VH / Vref | | |
| 202_other | VH / Vref | | |
| 203_N | Vref / VL | | |
| 203_other | Vref / VL | | |
| 204_M | VH / VM / Vref | | |
| 204_other | VH / VM / Vref | | |

902a
901a 902b
901b

MEMORY DEVICE AND ELECTRONIC DEVICE

CROSS-REFERENCE TO RELATED APPLICATIONS

This application is a continuation of U.S. application Ser. No. 14/297,668, filed Jun. 6, 2014, now allowed, which is a continuation of U.S. application Ser. No. 13/418,546, filed Mar. 13, 2012, now U.S. Pat. No. 8,760,959, which claims the benefit of a foreign priority application filed in Japan as Serial No. 2011-060175 on Mar. 18, 2011, all of which are incorporated by reference.

BACKGROUND OF THE INVENTION

1. Field of the Invention

One embodiment of the present invention relates to a memory device.

2. Description of the Related Art

In recent years, a variety of memory devices capable of rewriting data have been developed.

As an example of such a memory device, a memory device in which a selection transistor is provided in each memory cell can be given (for example, see Patent Document 1).

In the memory device in which the selection transistor is provided in the memory cell, a selection operation for the memory cell is performed by turning on the selection transistor, and an operation such as data writing is performed in the selected memory cell.

REFERENCE

Patent Document

[Patent Document 1] Japanese Published Patent Application No. H07-176184

SUMMARY OF THE INVENTION

However, in the conventional memory device that is described above, a selection operation is performed for the memory cells in each row and cannot be performed for the individual memory cells.

For example, even in the case where data writing is performed for a memory cell, another memory cell in the same row is also selected and data in all the memory cells in the row thus changes, which makes it necessary to rewrite data. Thus, it takes a long time for data writing.

An object of one embodiment of the present invention is to perform a selection operation for individual memory cells.

In one embodiment of the present invention, at least a first memory cell and a second memory cell which is provided in the same row as the first memory cell are provided.

Further, as a transistor which serves as a selection transistor in each memory cell, a transistor having a source, a drain, and two gates is used. A data signal is input to one of the source and the drain. The voltage of one of the two gates is controlled with a row selection signal that is a signal which selects a memory cell in the row direction. The voltage of the other of the two gates is controlled with a column selection signal that is a signal which selects a memory cell in the column direction. That is, a transistor serving as a selection transistor in a memory cell is selected with a row selection signal which selects a memory cell in the row direction and a column selection signal which selects a memory cell in the column direction.

Further, to the first memory cell and the second memory cell which are provided in the same row, column selection signals which are different from each other and the same row selection signals are input.

In one embodiment of the present invention, a transistor serving as an output transistor is provided. As the transistor serving as the output transistor, a transistor having a source, a drain, and two gates is used. One of the two gates is electrically connected to one of the source and the drain of the transistor serving as the output transistor, so that the transistor is diode-connected. The other of the two gates is electrically connected to the other of the source and the drain of the transistor serving as the selection transistor. With the use of the transistor serving as the output transistor, voltage change in a wiring serving as a data line due to leakage current in the output transistor is suppressed.

Further, in one embodiment of the present invention, the transistor serving as the output transistor is provided over the transistor serving as the selection transistor, whereby the circuit area is reduced.

According to one embodiment of the present invention, a selection operation can be performed for individual memory cells.

DETAILED DESCRIPTION OF THE INVENTION

Examples of embodiments of the present invention will be described below with reference to the drawings. Note that it will be readily appreciated by those skilled in the art that details of the embodiments can be modified in various ways without departing from the spirit and scope of the present invention. The present invention is therefore not limited to the following description of the embodiments.

Note that the details of the embodiments can be combined with each other as appropriate. In addition, the details of the embodiments can be replaced with each other.

Ordinal numbers such as "first" and "second" are used in order to avoid confusion among components and the number of components is not limited by the number of ordinal numbers.

Embodiment 1

In this embodiment, an example of a memory device in which a selection operation can be performed for individual memory cells is described.

An example of the memory device in this embodiment includes three or more memory cells which are arranged in the row and column directions. The memory cells are provided in a memory cell array, for example.

An example of the memory device in this embodiment is described with reference to FIGS. 1A and 1B.

First, an example of a structure of the memory device in this embodiment is described with reference to FIG. 1A.

Figures 1A, 1B:
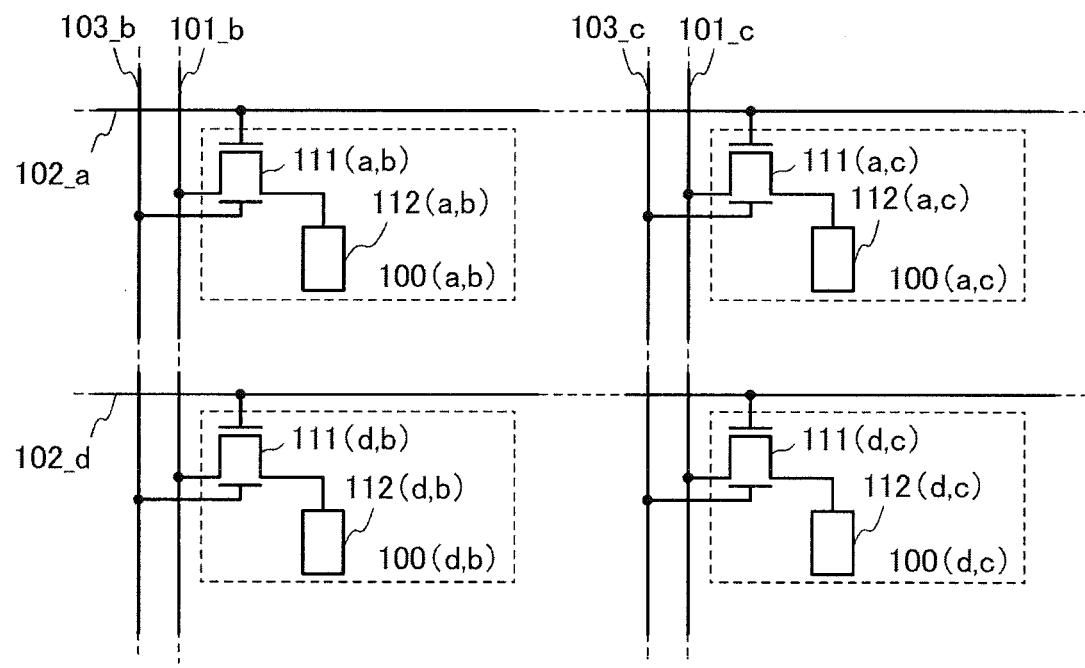
FIGS. 1A and 1B illustrate an example of a memory device.

The memory device illustrated in FIG. 1A includes a memory cell 100 (a,b) (a and b are natural numbers), a memory cell 100 (a,c) (c is a natural number larger than a), a memory cell 100 (d,b) (d is a natural number larger than b), and a memory cell 100 (d,c). Note that the memory cell 100 (d,c) is not necessarily provided. Further, a memory cell other than the memory cell 100 (a,b), the memory cell 100 (a,c), the memory cell 100 (d,b), and the memory cell 100 (d,c) may be provided. Further, a memory cell may be provided at any one or more of the following positions: between the memory cell 100 (a,b) and the memory cell 100 (a,c), between the memory cell 100 (a,b) and the memory cell 100 (d,b), between the memory cell 100 (d,b) and the memory cell 100 (d,c), and between the memory cell 100 (a,c) and the memory cell 100 (d,c). At this time, the structure of the memory cell may be the same as or different from those of the memory cells 100 (a,b), 100 (a,c), 100 (d,b), and 100 (d,c).

The memory cell 100 (a,c) is provided in the same row as the memory cell 100 (a,b).

The memory cell 100 (d,b) is provided in the same column as the memory cell 100 (a,b).

A row and a column in which the memory cell 100 (d,c) is provided are different from the row and the column in which the memory cell 100 (a,b) is provided, and the memory cell 100 (d,c) is provided in the same row as the memory cell 100 (d,b) and the same column as the memory cell 100 (a,c).

Further, each of the four memory cells 100 (the memory cell 100 (a,b), the memory cell 100 (a,c), the memory cell 100 (d,b), and the memory cell 100 (d,c)) includes a transistor 111 and a data holding circuit 112. Note that in FIG. 1A, the transistor 111 and the data holding circuit 112 are denoted with row and column numbers which are the same as those of the memory cell 100 in which the transistor 111 and the data holding circuit 112 are provided. For example, the transistor 111 provided in the memory cell 100 (a,b) is expressed as the transistor 111 (a,b), and the data holding circuit 112 provided in the memory cell 100 (a,b) is expressed as the data holding circuit 112 (a,b).

The term "voltage" generally means a difference between potentials at two points (also referred to as a potential difference). However, values of both a voltage and a potential are represented using volts (V) in a circuit diagram or the like in some cases, so that it is difficult to distinguish them. Thus, in this specification, a potential difference between a potential at one point and a potential to be a reference (also referred to as a reference potential) is used as voltage at the point in some cases unless otherwise specified.

The transistor 111 is a transistor that includes a source, a drain, a first gate, and a second gate.

In the memory cell 100 (a,b), a first row selection signal is input to the first gate of the transistor 111 and a first column selection signal is input to the second gate of the transistor 111.

In the memory cell 100 (a,c), the first row selection signal is input to the first gate of the transistor 111 and a second column selection signal is input to the second gate of the transistor 111.

In the memory cell 100 (d,b), a second row selection signal is input to the first gate of the transistor 111 and the first column selection signal is input to the second gate of the transistor 111.

In the memory cell 100 (d,c), the second row selection signal is input to the first gate of the transistor 111 and the second column selection signal is input to the second gate of the transistor 111.

Note that the row selection signal is a pulse signal for selection of a memory cell in the row direction, and the column selection signal is a pulse signal for selection of a memory cell in the column direction.

The transistor 111 has a function of controlling at least data writing and data holding in the memory cell 100 by being turned on or off and serves as a selection transistor.

A field-effect transistor can be used as the transistor 111, for example. As the transistor 111, for example, a transistor including an oxide semiconductor layer in which a channel is formed can be used. As another example, a transistor including a semiconductor layer in which a channel is formed and which contains a semiconductor belonging to Group 14 of the periodic table (e.g., silicon) can be used. In that case, the semiconductor layer is provided between the first gate and the second gate. Moreover, in that case, the circuit area of the memory device can be reduced by making the second gate overlap with the first gate with the semiconductor layer interposed therebetween.

The band gap of the oxide semiconductor layer is larger than that of silicon and for example, 2 eV or more, preferably 2.5 eV or more, far preferably 3 eV or more. Moreover, the oxide semiconductor layer is an intrinsic (or i-type) or substantially intrinsic semiconductor layer.

As the oxide semiconductor layer, it is possible to use, for example, a layer of an oxide which is non-single-crystal and includes a phase (also referred to as c-axis aligned crystal; CAAC) which has a triangular, hexagonal, regular triangular, or regular hexagonal atomic arrangement when seen from a direction perpendicular to the a-b plane and in which metal atoms are arranged in a layered manner in a direction perpendicular to the c-axis direction (also referred to as a thickness direction of a layer) or the metal atoms and oxygen atoms are arranged in a layered manner in the direction perpendicular to the c-axis direction. By using an oxide semiconductor layer including CAAC as a layer in which a channel of a transistor is formed (also referred to as a channel formation layer), deterioration of the transistor due to light, for example, can be suppressed.

It is possible to use, as the transistor 111, a transistor which includes the above oxide semiconductor layer having a pair of regions which are separated from each other and to which a dopant imparting one conductivity is added. In the transistor which includes the oxide semiconductor layer having the pair of regions to which the dopant is added, a channel is formed between the pair of regions, to which the dopant is added. It is preferable that the resistance of the pair of regions to which the dopant is added be lower than that of a region in which the channel is formed (also referred to as a channel formation region). With the use of the transistor which includes the oxide semiconductor layer having the pair of regions to which the dopant is added, resistance between the region in which the channel is formed (also referred to as the channel formation region) and a source or a drain of the transistor can be low, so that a reduction in the area of the transistor (also referred to as miniaturization of the transistor) is possible.

For example, the transistor including the oxide semiconductor layer is a transistor having an off-state current lower than that of a conventional transistor including a semiconductor layer (e.g., a silicon layer). The off-state current per micrometer of channel width of the transistor including the oxide semiconductor layer is lower than or equal to 10 aA ($1 \times 10^{-17}$ A), preferably lower than or equal to 1 aA ($1 \times 10^{-18}$ A), more preferably lower than or equal to 10 zA ($1 \times 10^{-20}$ A), much more preferably lower than or equal to 1 zA ($1 \times 10^{-21}$ A), still more preferably lower than or equal to 100 yA ($1 \times 10^{-22}$ A).

Further, the memory device illustrated in FIG. 1A includes data lines 101, row selection lines 102, and column selection lines 103. Note that in FIG. 1A, the data line 101 is denoted with a column number which is the same as that of the memory cell 100 to which the data line 101 is electrically connected. For example, the data line 101 electrically connected to the memory cell 100 (a,b) is expressed as a data line 101_b. Note that in FIG. 1A, the row selection line 102 is denoted with a row number which is the same as that of the memory cell 100 to which the row selection line 102 is electrically connected, and the column selection line 103 is denoted with a column number which is the same as that of the memory cell 100 to which the column selection line 103 is electrically connected. For example, the column selection line 103 electrically connected to the memory cell 100 (a,b) is expressed as a column selection line 103_b.

The data line 101_b is electrically connected to one of the source and the drain of the transistor 111 in each of the memory cells 100 (a,b) and 100 (d,b), and a data line 101_c is electrically connected to one of the source and the drain of the transistor 111 in each of the memory cells 100 (a,c) and 100 (d,c). A data line is a wiring for transmission and reception of data to/from the memory cell.

A row selection line 102_a is electrically connected to the first gate of the transistor 111 in each of the memory cells 100 (a,b) and 100 (a,c), and a row selection line 102_d is electrically connected to the first gate of the transistor 111 in each of the memory cells 100 (d,b) and 100 (d,c). A row selection line is a wiring to which the row selection signal is input.

A column selection line 103_b is electrically connected to the second gate of the transistor 111 in each of the memory cells 100 (a,b) and 100 (d,b), and a column selection line 103_c is electrically connected to the second gate of the transistor 111 in each of the memory cells 100 (a,c) and 100 (d,c). A column selection line is a wiring to which the column selection signal is input.

Note that a terminal of the transistor and a wiring are not necessarily formed separately; it is possible to make one conductive layer serve as both a terminal of the transistor and a wiring.

The data holding circuit 112 is a circuit having a function of holding data. Note that the data holding circuit 112 is not necessarily provided. Instead of providing the data holding circuit 112, the other of the source and the drain of the transistor 111 may be made to serve as a memory node or may be electrically connected to a memory node.

As the data holding circuit 112, for example, a circuit using a capacitor, a circuit using a transistor, or a circuit using both a capacitor and a transistor can be used.

Next, as an example of a method for driving the memory device in this embodiment, an example of a method for driving the memory device illustrated in FIG. 1A is described with reference to FIG. 1B. FIG. 1B is a timing chart for illustrating the example of the method for driving the memory device illustrated in FIG. 1A. Here, as an example, the case where data is written to the memory cell 100 (also referred to as a memory cell 100 (M,N)) in the M-th row and the N-th column (M is a or d, and N is b or c) between the memory cells 100 (a,b), 100 (a,c), 100 (d,b), and 100 (d,c) is described. The transistor 111 is an n-channel transistor. The threshold voltage of the transistor 111 is shifted in accordance with the voltage of the column selection line 103 (the voltage of the column selection signal).

In the case where data is written to the memory cell 100 (M,N) (also referred to as writing), the voltage of the N-th data line 101 (also referred to as a data line 101_N) is set to a voltage corresponding to a data signal, and the voltage of the data line 101 (also referred to as a data line 101_other) other than the N-th data line 101 is set equal to a reference potential Vref (not shown). Further, the voltage of the M-th row selection line 102 (also referred to as a row selection line 102_M) is set to a voltage VH which is higher than the reference potential Vref with an M-th row selection signal; the voltage of the row selection line 102 (also referred to as a row selection line 102_other) other than the M-th row selection line 102 is set equal to the reference potential Vref with a row selection signal other than the M-th row selection signal; the voltage of the N-th column selection line 103 (also referred to as a column selection line 103N) is set equal to the reference potential Vref with an N-th column selection signal; and the voltage of the column selection line 103 (also referred to as a column selection line 103_other) other than the N-th column selection line 103 is set to a voltage VL which is lower than the reference potential Vref with a column selection signal other than the N-th column selection signal. Note that voltage setting of all the row selection lines 102 is conducted after voltage setting of all the column selection lines 103. Further, the value of the reference potential Vref is set in accordance with specifications of the memory device. In addition, the value of the voltage VL is appropriately set so that the transistor 111 in the memory cell 100 which is not selected is certainly turned off. For example, the voltage VL can be generated with a negative voltage generation circuit.

At this time, the threshold voltage of the transistor 111 is set to a value corresponding to the voltage of the column selection line 103 (the voltage of the column selection signal). For example, in the case where the transistor 111 is an n-channel transistor, as the voltage of the column selection line 103 is lowered, the threshold voltage of the transistor 111 is shifted in a positive direction. Thus, the memory cell 100 in the M-th row and the N-th column is selected, the transistor 111 (also referred to as a transistor 111 (M,N)) in the memory cell 100 in the M-th row and the N-th column is turned on, data is written to the memory cell 100 in the M-th row and the N-th column in accordance with the voltage of the N-th data line 101 (also referred to as the data line 101_N), and the memory cell 100 other than the memory cell 100 in the M-th row and the N-th column is not selected and the transistor 111 therein is turned off.

Further, data can be written to all the memory cells 100 when the above-described operation is performed for the individual memory cells 100 by appropriately changing the voltages of the data lines 101, the row selection lines 102, and the column selection lines 103. Note that the present invention is not limited thereto; for example, data writing may be performed for the plurality of memory cells 100 (e.g., the memory cells 100 in a row).

The above is description of an example of a method for driving the memory device illustrated in FIG. 1A.

As described with reference to FIGS. 1A and 1B, in the example of the memory device in this embodiment, a first memory cell, a second memory cell provided in the same row as the first memory cell, and a third memory cell provided in the same column as the first memory cell are provided.

In addition, in the example of the memory device in this embodiment, a field-effect transistor having two gates and serving as a selection transistor is included in each of the first to third memory cells. In the first memory cell and the second memory cell which are provided in the same row, the voltage of one of the two gates of the field-effect transistor in the first memory cell and the voltage of one of the two gates of the field-effect transistor in the second memory cell are controlled with the same row selection signal, and the voltage of the other of the two gates of the field-effect transistor in the first memory cell and the voltage of the other of the two gates of the field-effect transistor in the second memory cell are controlled with different column selection signals. Moreover, in the first memory cell and the third memory cell which are provided in the same column, the voltage of one of the two gates of the field-effect transistor in the first memory cell and the voltage of one of the two gates of the field-effect transistor in the third memory cell are controlled with different row selection signals, and the voltage of the other of the two gates of the field-effect transistor in the first memory cell and the voltage of the other of the two gates of the field-effect transistor in the third memory cell are controlled with the same column selection signal. Further, at this time, it is possible to provide a semiconductor layer in which a channel is formed between the first gate and the second gate in such a manner that the second gate overlaps with the first gate with the semiconductor layer interposed therebetween, so that the circuit area of the memory device can be reduced.

In an example of the memory device in this embodiment, in the first and second memory cells which are provided in the same row, one of the two gates of the field-effect transistor in the first memory cell and one of the two gates of the field-effect transistor in the second memory cell are connected to the same wiring so as to be controlled and the other of the two gates of the field-effect transistor in the first memory cell and the other of the two gates of the field-effect transistor in the second memory cell are connected to different wirings so as to be controlled. Further, in the first and third memory cells which are provided in the same column, one of the two gates of the field-effect transistor in the first memory cell and one of the two gates of the field-effect transistor in the third memory cell are connected to different wirings so as to be controlled and the other of the two gates of the field-effect transistor in the first memory cell and the other of the two gates of the field-effect transistor in the third memory cell are connected to the same wiring so as to be controlled.

With the above-described structure, a selection operation can be performed for the individual memory cells. For example, while a field-effect transistor in a memory cell is in an on state, a field-effect transistor in another memory cell in the same row can be in an off state. Thus, rewriting of data becomes unnecessary, which can shorten writing time. In addition, with the use of the transistor having two gates, a selection operation can be performed for the individual memory cells without an increase in the number of elements in a memory cell.

Embodiment 2

In this embodiment, an example of the memory device in Embodiment 1 is described.

An example of the memory device in this embodiment is described with reference to FIGS. 2A and 2B.

First, an example of a structure of the memory device in this embodiment is described with reference to FIG. 2A.

Figures 2A, 2B:
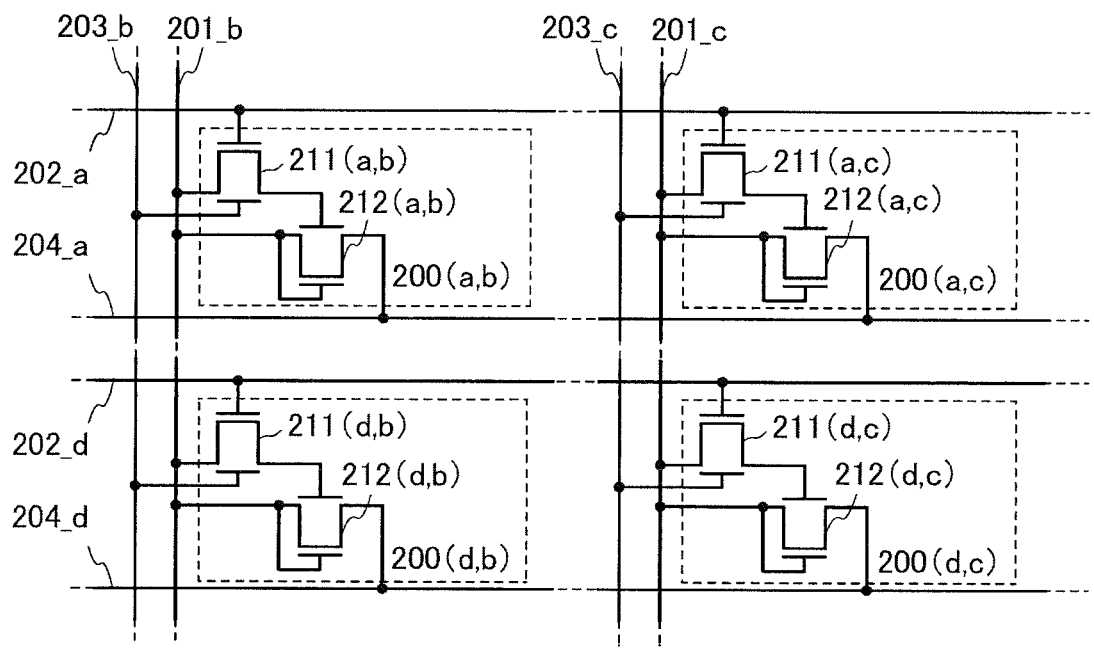
FIGS. 2A and 2B illustrate an example of a memory device.

The memory device illustrated in FIG. 2A includes a memory cell 200 (a,b), a memory cell 200 (a,c), a memory cell 200 (d,b), and a memory cell 200 (d,c). Note that the memory cell 200 (d,c) is not necessarily provided. Further, a memory cell other than the memory cell 200 (a,b), the memory cell 200 (a,c), the memory cell 200 (d,b), and the memory cell 200 (d,c) may be provided. Further, a memory cell may be provided at any one or more of the following positions: between the memory cell 200 (a,b) and the memory cell 200 (a,c), between the memory cell 200 (a,b) and the memory cell 200 (d,b), between the memory cell 200 (d,b) and the memory cell 200 (d,c), and between the memory cell 200 (a,c) and the memory cell 200 (d,c). At this time, the structure of the memory cell may be the same as or different from those of the memory cells 200 (a,b), 200 (a,c), 200 (d,b), and 200 (d,c).

The memory cell 200 (a,c) is provided in the same row as the memory cell 200 (a,b).

The memory cell 200 (d,b) is provided in the same column as the memory cell 200 (a,b).

A row and a column in which the memory cell 200 (d,c) is provided are different from the row and the column in which the memory cell 200 (a,b) is provided, and the memory cell 200 (d,c) is provided in the same row as the memory cell 200 (d,b) and the same column as the memory cell 200 (a,c).

Further, each of the memory cell 200 (a,b), the memory cell 200 (a,c), the memory cell 200 (d,b), and the memory cell 200 (d,c) includes a transistor 211 and a transistor 212. Note that in FIG. 2A, the transistor 211 and the transistor 212 are denoted with row and column numbers which are the same as those of the memory cell 200 in which the transistor 211 and the transistor 212 are provided.

The transistor 211 includes a first source, a first drain, a first gate, and a second gate.

In the memory cell 200 (a,b), a first row selection signal is input to the first gate of the transistor 211 and a first column selection signal is input to the second gate of the transistor 211.

In the memory cell 200 (a,c), the first row selection signal is input to the first gate of the transistor 211 and a second column selection signal is input to the second gate of the transistor 211.

In the memory cell 200 (d,b), a second row selection signal is input to the first gate of the transistor 211 and the first column selection signal is input to the second gate of the transistor 211.

In the memory cell 200 (d,c), the second row selection signal is input to the first gate of the transistor 211 and the second column selection signal is input to the second gate of the transistor 211.

The transistor 211 serves as a selection transistor.

As the transistor 211, a transistor that can be applied to the transistor 111 in FIG. 1A can be used.

The transistor 212 includes a second source, a second drain, a third gate, and a fourth gate.

The third gate of the transistor 212 is electrically connected to one of the second source and the second drain of the transistor 212, so that the transistor 212 is diode-connected.

Further, in the memory cell 200 (a,b), a first reading selection signal is input to the other of the second source and the second drain of the transistor 212.

In the memory cell 200 (a,c), the first reading selection signal is input to the other of the second source and the second drain of the transistor 212.

Further, in the memory cell 200 (d,b), a second reading selection signal is input to the other of the second source and the second drain of the transistor 212.

Further, in the memory cell 200 (d,c), the second reading selection signal is input to the other of the second source and the second drain of the transistor 212.

Note that a reading selection signal is a pulse signal for selection of a memory cell from which data is to be read.

The transistor 212 serves as an output transistor for reading data. The transistor 212 corresponds to the data holding circuit of the memory device in Embodiment 1.

As the transistor 212, a transistor that can be applied to the transistor 111 in FIG. 1A can be used. The transistor 212 may have a structure different from that of the transistor 211.

Further, the memory device illustrated in FIG. 2A includes data lines 201, row selection lines 202, column selection lines 203, and reading selection lines 204. Note that in FIG. 2A, the row selection line 202 and the reading selection line 204 are each denoted with a row number which is the same as that of the memory cell 200 to which the row selection line 202 and the reading selection line 204 are electrically connected, and the data line 201 and the column selection line 203 are each denoted with a column number which is the same as that of the memory cell 200 to which the data line 201 and the column selection line 203 are electrically connected.

A data line 201_b is electrically connected to one of the first source and the first drain of the transistor 211 in each of the memory cell 200 (a,b) and the memory cell 200 (d,b) and the one of the second source and the second drain of the transistor 212 in each of the memory cell 200 (a,b) and the memory cell 200 (d,b). A data line 201_c is electrically connected to the one of the first source and the first drain of the transistor 211 in each of the memory cell 200 (a,c) and the memory cell 200 (d,c) and the one of the second source and the second drain of the transistor 212 in each of the memory cell 200 (a,c) and the memory cell 200 (d,c). The fourth gate of the transistor 212 is electrically connected to the other of the first source and the first drain of the transistor 211. The voltage of the fourth gate of the transistor 212 is a voltage for setting a state of data stored in a memory cell.

A row selection line 202_a is electrically connected to the first gate of the transistor 211 in each of the memory cells 200 (a,b) and 200 (a,c), and a row selection line 202_d is electrically connected to the first gate of the transistor 211 in each of the memory cells 200 (d,b) and 200 (d,c).

A column selection line 203_b is electrically connected to the second gate of the transistor 211 in each of the memory cells 200 (a,b) and 200 (d,b), and a column selection line 203_c is electrically connected to the second gate of the transistor 211 in each of the memory cells 200 (a,c) and 200 (d,c).

A reading selection line 204_a is electrically connected to the other of the second source and the second drain of the transistor 212 in each of the memory cells 200 (a,b) and 200 (a,c), and a reading selection line 204_d is electrically connected to the other of the second source and the second drain of the transistor 212 in each of the memory cells 200 (d,b) and 200 (d,c). The reading selection line 204 is a wiring to which a reading selection signal for selection of a memory cell from which data is to be read is input.

Note that a terminal of the transistor and a wiring are not necessarily formed separately; it is possible to make one conductive layer serve as both a terminal of the transistor and a wiring.

Further, the transistor 211 and the transistor 212 may be provided to have a stacked-layer structure. For example, the transistor 211 may be provided over the transistor 212. When the transistor 211 and the transistor 212 are provided to have a stacked-layer structure, the circuit area of the memory cell can be reduced.

In addition, in the memory device in this embodiment, the memory cell may be provided over a driver circuit for controlling driving of the memory cell. In that case, the circuit area of the memory device can be reduced.

Next, as an example of a method for driving the memory device in this embodiment, an example of a method for driving the memory device illustrated in FIG. 2A is described with reference to FIG. 2B. FIG. 2B is a timing chart for illustrating the example of the method for driving the memory device illustrated in FIG. 2A. Here, as an example, an operation in the case where data is written to the memory cell 200 (also referred to as a memory cell 200 (M,N)) in the M-th row and the N-th column between the memory cells 200 (a,b), 200 (a,c), 200 (d,b), and 200 (d,c) and an operation in the case where data stored in the memory cell 200 (M,N) is read are described. The transistor 211 and the transistor 212 are n-channel transistors. Further, voltage VDD which is higher than the reference potential is data (1) and a voltage equal to the reference potential Vref is data (0). The threshold voltage of the transistor 211 is shifted in accordance with the voltage of the column selection line 203 (the voltage of the column selection signal).

In the case where data is written to the memory cell 200 (M,N) (writing), the voltage of the N-th data line 201 (also referred to as a data line 201_N) is set to a voltage corresponding to a data signal, and the voltage of the data line 201 (also referred to as a data line 201_other) other than the N-th data line 201 is set equal to the reference potential Vref (not shown). Further, the voltage of the M-th row selection line 202 (also referred to as a row selection line 202_M) is set to the voltage VH which is higher than the reference potential Vref with the M-th row selection signal; the voltage of the row selection line 202 (also referred to as a row selection line 202_other) other than the M-th row selection line 202 is set equal to the reference potential Vref with a row selection signal other than the M-th row selection signal; the voltage of the N-th column selection line 203 (also referred to as a column selection line 203_N) is set equal to the reference potential Vref with the N-th column selection signal; and the voltage of the column selection line 203 (also referred to as a column selection line 203_other) other than the N-th column selection line 203 is set to the voltage VL which is lower than the reference potential Vref with a column selection signal other than the N-th column selection signal. Note that voltage setting of all the row selection lines 202 is conducted after voltage setting of all the column selection lines 203. In addition, the voltage of the M-th reading selection line 204 (also referred to as a reading selection line 204_M) may be set to the voltage VH and the voltage of the reading selection line 204 other than the M-th reading selection line 204 (also referred to as a reading selection line 204_other) may be set to the voltage VH. In this case, the transistor 212 can be certainly turned off and leakage current which flows between the source and the drain of the transistor 212 can be thus suppressed.

At this time, the threshold voltage of the transistor 211 is set to a value corresponding to the voltage of the column selection line 203 (the voltage of the column selection signal). Thus, the memory cell 200 (M,N) is selected, the transistor 211 (a transistor 211 (M,N)) in the memory cell 200 (M,N) is turned on, the voltage of the fourth gate of the transistor 212 (M,N) in the memory cell 200 (M,N) is set to a value corresponding to the voltage of the N-th data line 201 (also referred to as the data line 201_N), and data is written to the memory cell 200 (M,N). The memory cell other than the memory cell 200 (M,N) is not selected and the transistor 211 therein is turned off. Note that the value of the voltage VL is appropriately set so that the transistor 211 is certainly turned off.

Further, data can be written to all the memory cells 200 when the above-described operation is performed for the individual memory cells 200 by appropriately changing the voltages of the data lines 201, the row selection lines 202, the column selection lines 203, and the reading selection lines 204. Note that the present invention is not limited thereto; for example, data writing may be performed for the plurality of memory cells 200 (e.g., the memory cells 200 in a row).

In the case where data in the memory cell 200 (M,N) is read (also referred to as reading), the voltage of the N-th data line 201 (the data line 201_N) is set to the voltage VH, and the voltage of the data line 201 (the data line 201_other) other than the N-th data line 201 is set equal to the reference potential Vref (not shown). Further, the voltage of the M-th row selection line 202 (the row selection line 202_M) is set equal to the reference potential Vref with the M-th row selection signal; the voltage of the row selection line 202 (the row selection line 202_other) other than the M-th row selection line 202 is set equal to the reference potential Vref with a row selection signal other than the M-th row selection signal; the voltage of the N-th column selection line 203 (the column selection line 203_N) is set equal to the reference potential Vref with the N-th column selection signal; and the voltage of the column selection line 203 (the column selection line 203_other) other than the N-th column selection line 203 is set equal to the reference potential Vref with a column selection signal other than the N-th column selection signal. In addition, the voltage of the M-th reading selection line 204 (the reading selection line 204_M) is set to a voltage VM which is higher than the reference potential Vref and lower than the voltage VH and the voltage of the reading selection line 204 other than the M-th reading selection line 204 (the reading selection line 204_other) is set to the voltage VH. Note that the value of the voltage VM is appropriately set such that the transistor 211 is turned off when the voltage of the fourth gate of the transistor 212 is equal to the reference potential Vref.

At this time, the transistor 211 in the memory cell 200 in the M-th row and the N-th column is turned off.

The threshold voltage of the transistor 212 is set in accordance with the voltage of the fourth gate of the transistor 212. For example, in the case where the transistor 212 is an n-channel transistor, when the voltage of the fourth gate of the transistor 212 is the voltage VDD, the threshold voltage of the transistor 212 is shifted in a negative direction as compared to the case where the voltage of the fourth gate of the transistor 212 is equal to the reference potential Vref.

Thus, when the voltage of the fourth gate of the transistor 212 (M,N) is the voltage VDD (data (1)) with the voltage of the reading selection line 204_M being the voltage VM, the transistor 212 (M,N) is turned on and the voltage of a data line 201_N is changed. Further, at this time, since the transistor 212 (M,N) is diode-connected, current does not flow in a direction from the reading selection line 204_M to the data line 201_N.

Further, when the voltage of the fourth gate of the transistor 212 (M,N) is equal to the reference potential Vref (data (0)) with the voltage of the reading selection line 204_M being the voltage VM, the transistor 212 (M,N) is turned off and the voltage of the data line 201_N is not changed.

Thus, data in the memory cell 200 (M,N) can be read by detecting the voltage of the data line 201_N with an external read circuit, for example.

Further, data in all the memory cells 200 can be read when the above-described operation is performed for the memory cells 200 in each row by appropriately changing the voltages of the data lines 201, the row selection lines 202, the column selection lines 203, and the reading selection lines 204. At this time, to sequentially read data in the plurality of memory cells 200 provided in the same column, after data in one memory cell 200 is read, before data in another memory cell provided in the same column as the one memory cell 200 is read, the voltage of the data line 201 to which a memory cell other than the one memory cell 200 provided in the same column as the one memory cell 200 is electrically connected is set to the voltage VH.

The above is description of an example of a method for driving the memory device illustrated in FIG. 2A.

Figure 3:
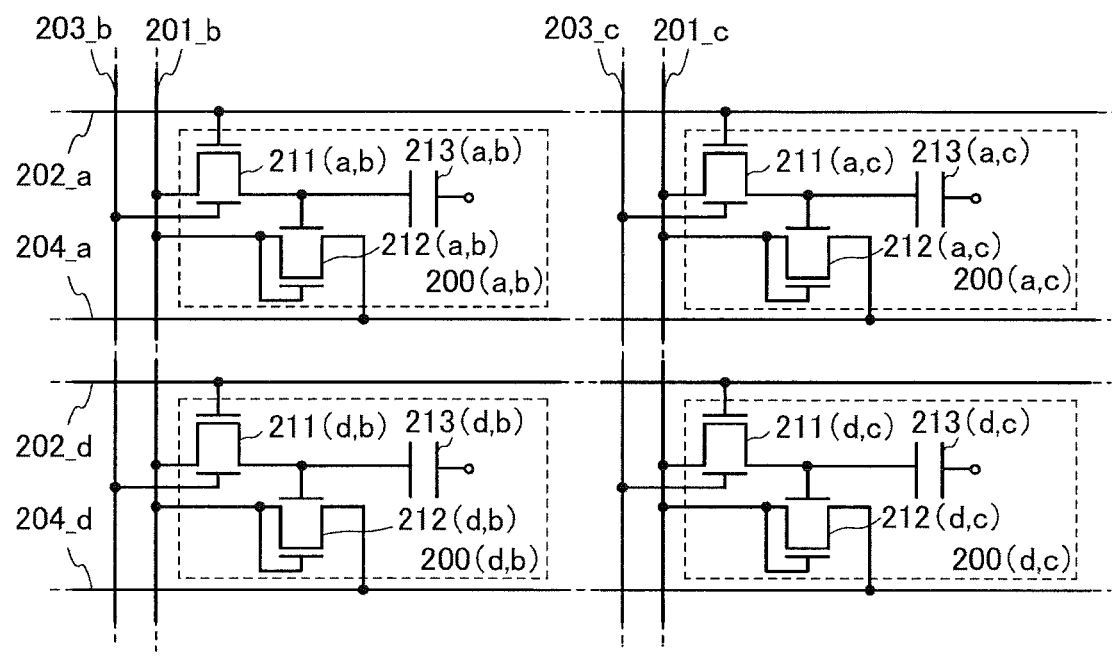
FIG. 3 illustrates an example of a memory device.

Note that in the memory device in this embodiment, for example, each of the memory cells 200 may include a capacitor 213 in addition to the components illustrated in FIG. 2A as illustrated in FIG. 3.

The capacitor 213 includes a first capacitor electrode and a second capacitor electrode. The first capacitor electrode of the capacitor 213 is electrically connected to the other of the first source and the first drain of the transistor 211. The second capacitor electrode of the capacitor 213 is grounded. Further, a predetermined signal may be input to the second capacitor electrode of the capacitor 213.

As described with reference to FIGS. 2A and 2B and FIG. 3, in the example of the memory device in this embodiment, a first memory cell, a second memory cell provided in the same row as the first memory cell, and a third memory cell provided in the same column as the first memory cell are provided.

In addition, in the example of the memory device in this embodiment, a first field-effect transistor having a first source, a first drain, a first gate, and a second gate is included in each of the first to third memory cells. In the first memory cell and the second memory cell which are provided in the same row and different columns, the voltage of the first gate of the first field-effect transistor in the first memory cell and the voltage of the first gate of the first field-effect transistor in the second memory cell are controlled with the same row selection signal, and the voltage of the second gate of the first field-effect transistor in the first memory cell and the voltage of the second gate of the first field-effect transistor in the second memory cell are controlled with different column selection signals. Further, in the first memory cell and the third memory cell which are provided in the same column, the voltage of the first gate of the first field-effect transistor in the first memory cell and the voltage of the first gate of the first field-effect transistor in the third memory cell are controlled with different row selection signals, and the voltage of the second gate of the first field-effect transistor in the first memory cell and the voltage of the second gate of the first field-effect transistor in the third memory cell are controlled with the same column selection signal.

In an example of the memory device in this embodiment, in the first and second memory cells which are provided in the same row, the first gate of the first field-effect transistor in the first memory cell and the first gate of the first field-effect transistor in the second memory cell are connected to the same wiring so as to be controlled and the second gate of the first field-effect transistor in the first memory cell and the second gate of the first field-effect transistor in the second memory cell are connected to different wirings so as to be controlled. Further, in the first and third memory cells which are provided in the same column, the first gate of the first field-effect transistor in the first memory cell and the first gate of the first field-effect transistor in the third memory cell are connected to different wirings so as to be controlled and the second gate of the first field-effect transistor in the first memory cell and the second gate of the first field-effect transistor in the third memory cell are connected to the same wiring so as to be controlled.

With the above-described structure, a selection operation can be performed for the individual memory cells. For example, while a field-effect transistor in a memory cell is in an on state, a field-effect transistor in another memory cell in the same row can be in an off state. Thus, rewriting of data becomes unnecessary, which can shorten writing time.

Further, in the example of the memory device in this embodiment, each of the first to third memory cells includes a second field-effect transistor having a second source, a second drain, a third gate, and a fourth gate. The third gate of the second field-effect transistor is electrically connected to one of the second source and the second drain, and the fourth gate is electrically connected to the first source or the first drain of the first field-effect transistor; thus, leakage current which flows between the second source and the second drain when the second field-effect transistor is in an off state can be suppressed. Accordingly, voltage change in a wiring serving as a data line can be suppressed, so that the reliability of the memory device can be improved.

Embodiment 3

Figure 4A:
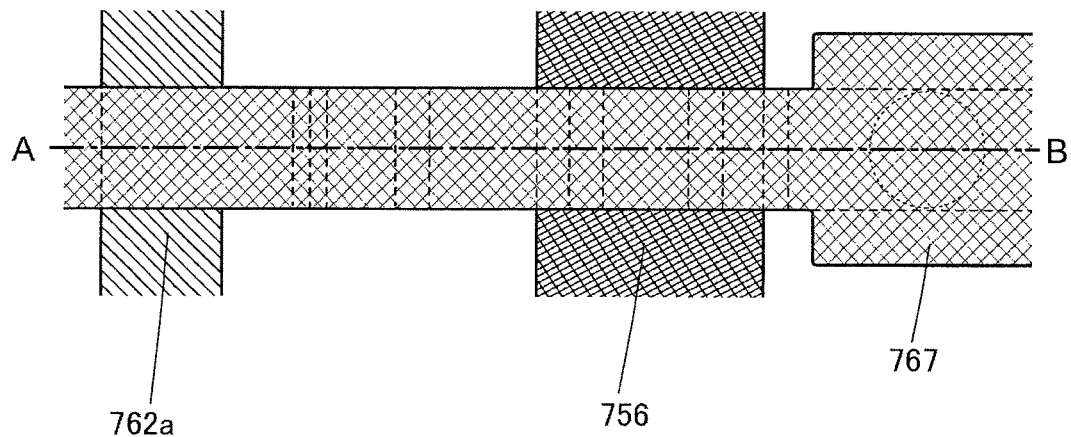
FIGS. 4A and 4B illustrate an example of a structure of a memory device.
Figure 4B:
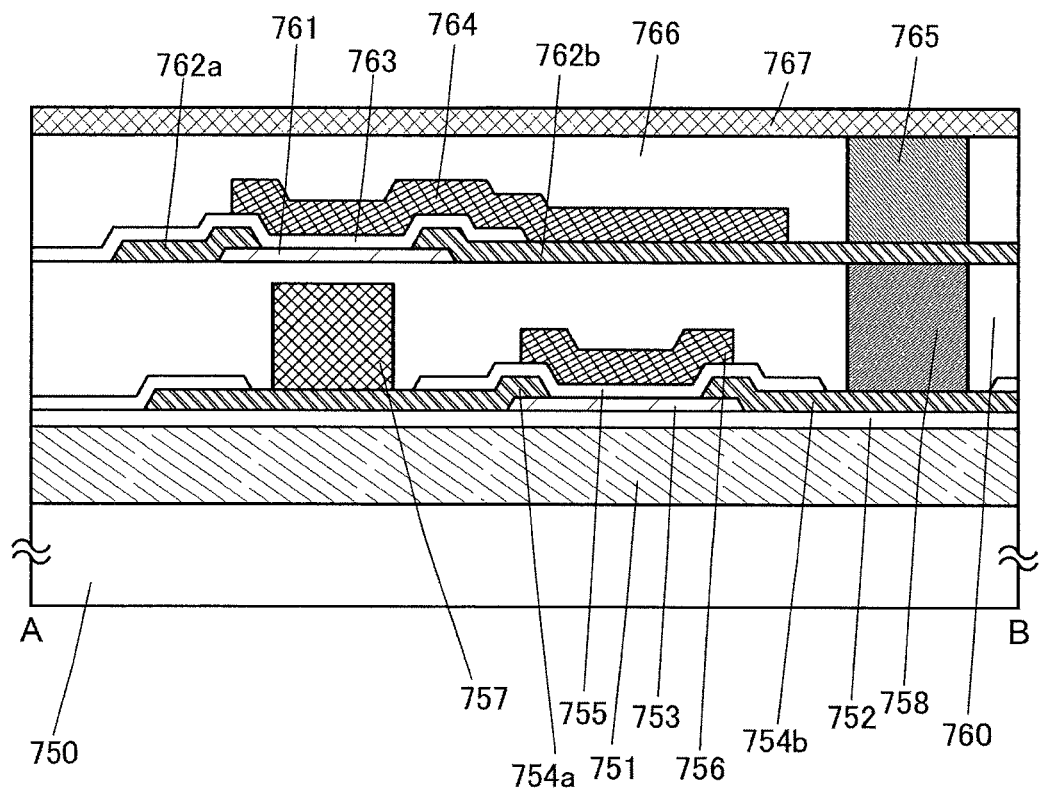

In this embodiment, an example of a structure of a memory cell in the memory device in Embodiment 2 is described with reference to FIGS. 4A and 4B. FIGS. 4A and 4B illustrate an example of a structure of the memory cell in this embodiment. An example of a structure of the memory cell illustrated in FIGS. 2A and 2B is described here as an example. Note that the components illustrated in FIGS. 4A and 4B include those having sizes different from the actual sizes.

The memory cell illustrated in FIGS. 4A and 4B includes a conductive layer 751, an insulating layer 752, a semiconductor layer 753, a conductive layer 754a, a conductive layer 754b, an insulating layer 755, a conductive layer 756, a conductive layer 757, a conductive layer 758, an insulating layer 760, a semiconductor layer 761, a conductive layer 762a, a conductive layer 762b, an insulating layer 763, a conductive layer 764, a conductive layer 765, an insulating layer 766, and a conductive layer 767.

The conductive layer 751 is provided over a substrate 750. The conductive layer 751 serves as one of two gates of a transistor that serves as a selection transistor in the memory cell (a gate to which a column selection signal is input). Further, the conductive layer 751 may serve as a column selection line. Note that such a layer serving as a gate of a transistor is also referred to as a gate electrode or a gate wiring.

As the conductive layer 751, it is possible to use, for example, a layer of a metal material such as molybdenum, magnesium, titanium, chromium, tantalum, tungsten, aluminum, copper, neodymium, or scandium or an alloy material containing any of these materials as a main component. The conductive layer 751 can be formed by stacking layers formed using materials that can be used for the conductive layer 751.

As the substrate 750, for example, a glass substrate or a plastic substrate can be used.

The insulating layer 752 is provided over the conductive layer 751. The insulating layer 752 serves as a gate insulating layer of the transistor serving as the selection transistor in the memory cell.

As the insulating layer 752, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used. The insulating layer 752 may be formed by stacking layers formed using materials that can be used for the insulating layer 752.

The semiconductor layer 753 overlaps with the conductive layer 751 with the insulating layer 752 interposed therebetween.

As the semiconductor layer 753, for example, it is possible to use an oxide semiconductor layer, or a semiconductor layer containing a semiconductor (e.g., silicon) which belongs to Group 14 of the periodic table.

Examples of an oxide semiconductor that can be used for the oxide semiconductor layer include four-component metal oxide, three-component metal oxide, and two-component metal oxide.

As the four-component metal oxide, an In—Sn—Ga—Zn—O-based metal oxide or the like can be used, for example.

As the three-component metal oxide, an In—Ga—Zn—O-based metal oxide, an In—Sn—Zn—O-based metal oxide, an In—Al—Zn—O-based metal oxide, a Sn—Ga—Zn—O-based metal oxide, an Al—Ga—Zn—O-based metal oxide, a Sn—Al—Zn—O-based metal oxide, or the like can be used, for example.

As the two-component metal oxide, an In—Zn—O-based metal oxide, a Sn—Zn—O-based metal oxide, an Al—Zn—O-based metal oxide, a Zn—Mg—O-based metal oxide, a Sn—Mg—O-based metal oxide, an In—Mg—O-based metal oxide, an In—Sn—O-based metal oxide, or an In—Ga—O-based metal oxide can be used, for example.

In addition, an In—O-based metal oxide, a Sn—O-based metal oxide, a Zn—O-based metal oxide, or the like can also be used as the oxide semiconductor. Further, the metal oxide that can be used as the oxide semiconductor may contain silicon oxide.

In the case where an In—Zn—O-based metal oxide is used, for example, an oxide target having the following composition ratios can be used for formation of an In—Zn—O-based metal oxide semiconductor layer: In:Zn=50:1 to 1:2 ($In_2O_3$:ZnO=25:1 to 1:4 in a molar ratio), preferably In:Zn=20:1 to 1:1 ($In_2O_3$:ZnO=10:1 to 1:2 in a molar ratio), more preferably In:Zn=15:1 to 1.5:1 ($In_2O_3$:ZnO=15:2 to 3:4 in a molar ratio). For example, when the atomic ratio of the target used for the formation of the In—Zn—O-based oxide semiconductor is expressed by In:Zn:O=S:U:R, R>1.5S+U. The increase in the In content can make the mobility of the transistor higher.

As the oxide semiconductor, a material represented by $InLO_3(ZnO)_m$ (m is a number of greater than 0) can be used. Here, L in $InLO_3(ZnO)_m$ represents one or more metal elements selected from Ga, Al, Mn, and Co.

At least a region of the semiconductor layer 753, in which a channel is formed may be crystalline and non-single-crystal and include a phase which has a triangular, hexagonal, regular triangular, or regular hexagonal atomic arrangement when seen from the direction perpendicular to the a-b plane and in which metal atoms are arranged in a layered manner in the direction perpendicular to the c-axis direction or the metal atoms and oxygen atoms are arranged in a layered manner in the direction perpendicular to the c-axis direction.

The conductive layer 754a is electrically connected to the semiconductor layer 753. The conductive layer 754a serves as a source or a drain of the transistor serving as the selection transistor in the memory cell. Note that a conductive layer serving as a source of a transistor is also referred to as a source electrode or a source wiring, and a conductive layer serving as a drain of a transistor is also referred to as a drain electrode or a drain wiring.

The conductive layer 754b is electrically connected to the semiconductor layer 753. The conductive layer 754b serves as the source or the drain of the transistor that serves as the selection transistor in the memory cell.

Each of the conductive layer 754a and the conductive layer 754b can be, for example, a layer of a metal material such as aluminum, magnesium, chromium, copper, tantalum, titanium, molybdenum, or tungsten; or an alloy material which contains any of the above metal materials as a main component. As a layer of an alloy material, a layer of a Cu—Mg—Al alloy material can be used, for example.

Further, each of the conductive layer 754a and the conductive layer 754b can be a layer containing conductive metal oxide. Note that silicon oxide may be contained in conductive metal oxide that can be used for the conductive layer 754a and the conductive layer 754b.

The conductive layer 754a and the conductive layer 754b may be formed by stacking layers formed using the materials that can be used for the conductive layer 754a and the conductive layer 754b. For example, when each of the conductive layer 754a and the conductive layer 754b is formed by stacking a layer of copper over a layer of a Cu—Mg—Al alloy material, the conductive layer 754a and the conductive layer 754b can have high adhesiveness with a layer which is in contact therewith.

The insulating layer 755 is provided over the semiconductor layer 753, the conductive layer 754a, and the conductive layer 754b. The insulating layer 755 serves as a gate insulating layer of the transistor that serves as the selection transistor in the memory cell.

As the insulating layer 755, for example, a layer formed using any of the materials that can be used for the insulating layer 752, which may be the same as or different from the material used for the insulating layer 752, can be used. The insulating layer 755 may be formed by stacking layers formed using materials that can be used for the insulating layer 755.

The conductive layer 756 overlaps with the semiconductor layer 753 with the insulating layer 755 interposed therebetween. The conductive layer 756 serves as one of the two gates of the transistor that serves as the selection transistor in the memory cell (a gate to which a row selection signal is input). Further, the conductive layer 756 may serve as a row selection line.

As the conductive layer 756, for example, a layer formed using any of the materials that can be used for the conductive layer 751, which may be the same as or different from the material used for the conductive layer 751, can be used. The conductive layer 756 may be formed by stacking layers formed using materials that can be used for the conductive layer 756.

The conductive layer 757 is electrically connected to the conductive layer 754a through a first opening portion formed in the insulating layer 755. The conductive layer 757 serves as one of two gates of a transistor that serves as an output transistor (a gate electrically connected to one of the two gates of the transistor that serves as the selection transistor). Note that the conductive layer 757 is preferably thicker than the conductive layer 756. When the conductive layer 757 is thicker than the conductive layer 756, parasitic capacitance generated by the conductive layer 756 and another conductive layer can be small.

As the conductive layer 757, for example, a layer formed using any of the materials that can be used for the conductive layer 751, which may be the same as or different from the material used for the conductive layer 751, can be used. The conductive layer 757 may be formed by stacking layers formed using materials that can be used for the conductive layer 757.

The conductive layer 758 is electrically connected to the conductive layer 754b through a second opening portion formed in the insulating layer 755. The conductive layer 758 serves as an electrode or a wiring. Note that the conductive layer 758 is thicker than the conductive layer 757. The conductive layer 758 is not necessarily provided.

As the conductive layer 758, for example, a layer formed using any of the materials that can be used for the conductive layer 751, which may be the same as or different from the material used for the conductive layer 751, can be used. The conductive layer 758 may be formed by stacking layers formed using materials that can be used for the conductive layer 758.

The insulating layer 760 is provided over the insulating layer 755, the conductive layer 756, and the conductive layer 757. The insulating layer 760 serves as a planarizing layer and a gate insulating layer of the transistor serving as the output transistor in the memory cell.

As the insulating layer 760, a layer formed using the material that can be used for the insulating layer 752 can be used. The insulating layer 760 may be formed by stacking layers formed using materials that can be used for the insulating layer 760.

The semiconductor layer 761 overlaps with the conductive layer 757 with the insulating layer 760 interposed therebetween.

As the semiconductor layer 761, for example, a layer formed using any of materials that can be used for the semiconductor layer 753, which may be the same as or different from the material used for the semiconductor layer 753, can be used.

The conductive layer 762a is electrically connected to the semiconductor layer 761. The conductive layer 762a serves as a source or a drain of the transistor that serves as the output transistor in the memory cell.

The conductive layer 762b is electrically connected to the semiconductor layer 761 and the conductive layer 754b. The conductive layer 762b serves as the source or the drain of the transistor that serves as the output transistor in the memory cell.

As the conductive layer 762a and the conductive layer 762b, for example, layers formed using any of the materials that can be used for the conductive layer 754a and the conductive layer 754b, which may be the same as or different from the materials used for the conductive layer 754a and the conductive layer 754b, can be used. The conductive layer 762a and the conductive layer 762b may each be formed by stacking layers formed using materials that can be used for the conductive layer 762a and the conductive layer 762b.

The insulating layer 763 is provided over the semiconductor layer 761, the conductive layer 762a, and the conductive layer 762b. The insulating layer 763 serves as a gate insulating layer of the transistor that serves as the output transistor in the memory cell.

The insulating layer 763 can be formed using, for example, any of the materials that can be used for the insulating layer 752, which may be the same as or different from the material used for the insulating layer 752. The insulating layer 763 may be formed by stacking layers formed using materials that can be used for the insulating layer 763.

The conductive layer 764 overlaps with the semiconductor layer 761 with the insulating layer 763 interposed therebetween and is electrically connected to the conductive layer 762b through an opening portion formed in the insulating layer 763. The conductive layer 764 serves as one of the two gates of the transistor that serves as the output transistor in the memory cell (a gate electrically connected to one of the source and the drain of the transistor that serves as the output transistor).

The conductive layer 764 can be formed using, for example, any of the materials that can be used for the conductive layer 751, which may be the same as or different from the material used for the conductive layer 751. The conductive layer 764 may be formed by stacking layers formed using materials that can be used for the conductive layer 764.

The conductive layer 765 is electrically connected to the conductive layer 762b through an opening portion formed in the insulating layer 763. The conductive layer 765 serves as an electrode or a wiring.

The conductive layer 765 can be formed using, for example, any of the materials that can be used for the conductive layer 751, which may be the same as or different from the material used for the conductive layer 751. The conductive layer 765 may be formed by stacking layers formed using materials that can be used for the conductive layer 765.

The insulating layer 766 is provided over the conductive layer 762b, the insulating layer 763, and the conductive layer 764.

The insulating layer 766 can be formed using any of the materials that can be used for the insulating layer 752, which may be the same as or different from the material used for the insulating layer 752. The insulating layer 766 may be formed by stacking layers formed using materials that can be used for the insulating layer 766.

The conductive layer 767 is electrically connected to the conductive layer 765. The conductive layer 767 serves as a wiring for transmission and reception of data.

As the conductive layer 767, for example, a layer formed using any of the materials that can be used for the conductive layer 754a and the conductive layer 754b, which may be the same as or different from the materials used for the conductive layer 754a and the conductive layer 754b, can be used. The conductive layer 767 may be formed by stacking layers formed using materials that can be used for the conductive layer 767.

Figure 5:
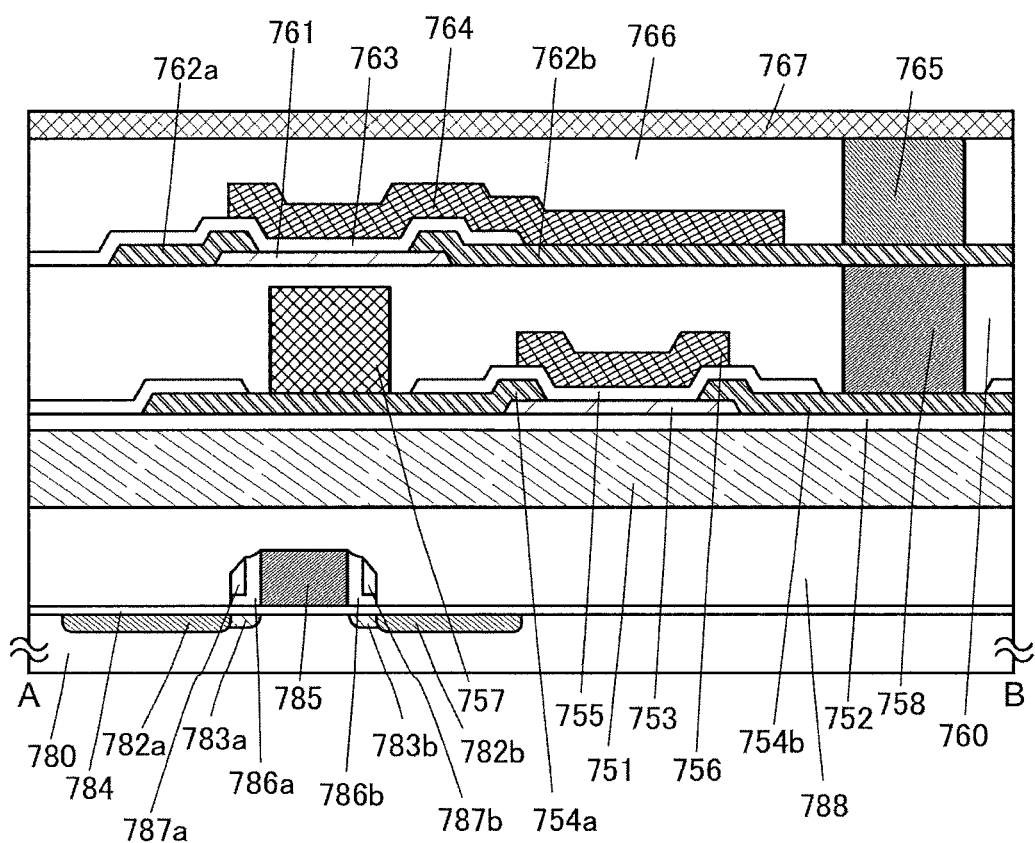
FIG. 5 is a schematic cross-sectional view illustrating an example of a method for manufacturing a memory device.

Further, a memory cell can be formed over a driver circuit for controlling driving of the memory cell. An example of a structure of the memory cell provided over the driver circuit is illustrated in FIG. 5. Note that, for a part in FIG. 5 which includes the same component as FIGS. 4A and 4B, description of the example of the structure of the memory cell illustrated in FIGS. 4A and 4B can be referred to as appropriate.

The memory cell illustrated in FIG. 5 is not provided over the substrate 750 illustrated in FIGS. 4A and 4B but is provided over a semiconductor layer 780 for forming a field-effect transistor of the driver circuit.

Further, the semiconductor layer 780 includes a region 782a, a region 782b, a region 783a, and a region 783b.

As the semiconductor layer 780, for example, a semiconductor substrate can be used. Alternatively, a semiconductor layer provided over a different substrate can be used as the semiconductor layer 780.

Note that in a region of the semiconductor layer 780 which is between a plurality of memory cells, an insulating separation region may be provided.

The region 782a and the region 782b are regions which are separated from each other and to which a dopant imparting n-type or p-type conductivity is added. The region 782a and the region 782b serve as a source region and a drain region of a transistor that serves as an output transistor in the memory cell.

The region 783a and the region 783b are provided between the region 782a and the region 782b so as to be separated from each other, and a region between the region 783a and the region 783b serves as a channel formation region. The region 783a is in contact with the region 782a, and the region 783b is in contact with the region 782b.

As in the region 782a and the region 782b, the region 783a and the region 783b are regions to which a dopant imparting n-type or p-type conductivity is added.

Note that the concentration of the dopant of the region 783a and the region 783b may be lower than the concentration of the dopant of the region 782a and the region 782b. In that case, the region 783a and the region 783b are also referred to as low concentration regions. Further, in that case, the region 782a and the region 782b may be referred to as high concentration regions. The region 783a and the region 783b may have a shallower depth than the region 782a and the region 782b; however, the present invention is not limited thereto.

The insulating layer 784 is provided over the semiconductor layer 780. The insulating layer 784 serves as a gate insulating layer of the transistor of the driver circuit.

As the insulating layer 784, for example, a layer of a material such as silicon oxide, silicon nitride, silicon oxynitride, silicon nitride oxide, aluminum oxide, aluminum nitride, aluminum oxynitride, aluminum nitride oxide, hafnium oxide, or an organic insulating material (e.g., polyimide or acrylic) can be used. The insulating layer 784 may be formed by stacking layers formed using materials that can be used for the insulating layer 784.

The conductive layer 785 overlaps with the semiconductor layer 780 with the insulating layer 784 interposed therebetween. A region of the semiconductor layer 780, which overlaps with the conductive layer 785 serves as the channel formation region of the transistor of the driver circuit. The conductive layer 785 serves as a gate of the transistor of the driver circuit.

The conductive layer 785 can be formed using, for example, any of the materials that can be used for the conductive layer 751, which may be the same as or different from the material used for the conductive layer 751. The conductive layer 785 can also be Mimed by stacking layers formed using materials that can be used for the conductive layer 785.

The insulating layer 786a is provided over the insulating layer 784 and is in contact with one of a pair of side surfaces of the conductive layer 785 which face each other.

The insulating layer 786b is provided over the insulating layer 784 and is in contact with the other of the pair of side surfaces of the conductive layer 785 which face each other.

The insulating layer 787a is provided over the insulating layer 786a.

The insulating layer 787b is provided over the insulating layer 786b.

An insulating layer 788 is provided over the insulating layer 784, the conductive layer 785, the insulating layer 786a, the insulating layer 786b, the insulating layer 787a, and the insulating layer 787b.

The insulating layer 786a, the insulating layer 786b, the insulating layer 787a, the insulating layer 787b, and the insulating layer 788 can be formed using any of the materials that can be used for the insulating layer 784, which may be the same as or different from the material used for the insulating layer 784. Further, the insulating layer 786a, the insulating layer 786b, the insulating layer 787a, the insulating layer 787b, and the insulating layer 788 can each be formed by stacking layers formed using materials that can be used for the insulating layer 786a, the insulating layer 786b, the insulating layer 787a, the insulating layer 787b, and the insulating layer 788.

Note that the structure of the transistor of the driver circuit is not limited to the above.

When the memory cell is provided over the driver circuit as illustrated in FIG. 5, an increase in the circuit area can be suppressed.

As an example of a method for manufacturing the memory cell in this embodiment, an example of a method for manufacturing the memory cell illustrated in FIGS. 4A and 4B is described with reference to FIGS. 6A to 6C, FIGS. 7A to 7C, FIGS. 8A and 8B, FIGS. 9A and 9B, FIGS. 10A and 10B, FIGS. 11A and 11B, FIGS. 12A and 12B, FIGS. 13A and 13B, and FIGS. 14A and 14B.

Figure 6A:
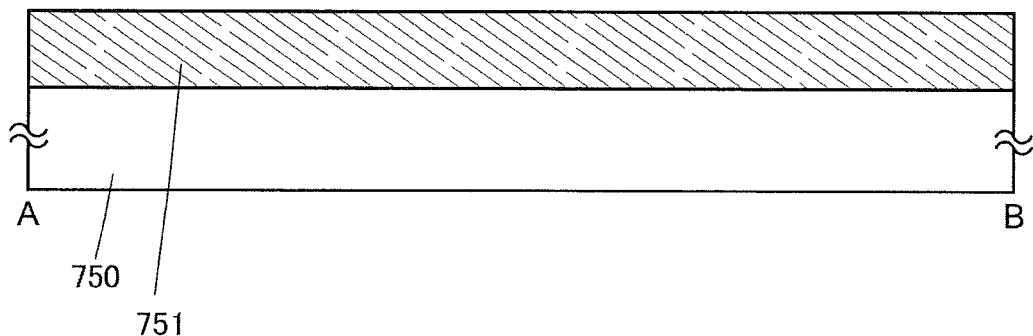
FIGS. 6A to 6C are schematic cross-sectional views illustrating an example of a method for manufacturing a memory device.

First, as illustrated in FIG. 6A, a first conductive film is formed over the substrate 750 and is partly etched, so that the conductive layer 751 is formed.

For example, the first conductive film can be formed by formation of a film of the material that can be used for the conductive layer 751 by sputtering or the like.

Alternatively, for example, a resist mask is formed over part of a layer or a film by a photolithography process, and the layer or the film can be partly etched using the resist mask. Note that in that case, the resist mask is removed after the etching unless otherwise specified.

Figure 6B:
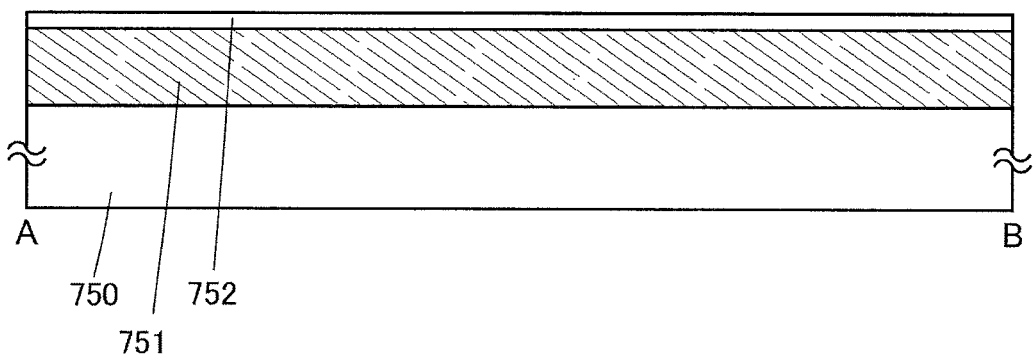

Then, as illustrated in FIG. 6B, the insulating layer 752 is formed over the conductive layer 751.

For example, the insulating layer 752 can be formed by formation of a film of the material that can be used for the insulating layer 752 by a sputtering method, a CVD method, or the like.

Figure 6C:
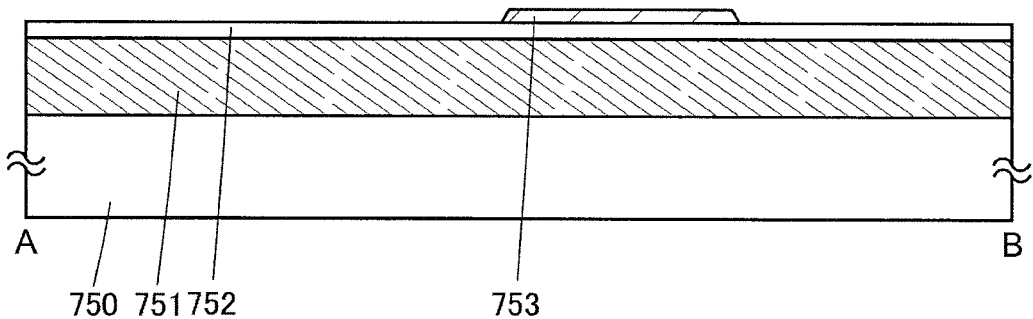

Then, as illustrated in FIG. 6C, a semiconductor film is formed over the insulating layer 752 and is partly etched, so that the semiconductor layer 753 is formed.

For example, an oxide semiconductor film can be formed by formation of a film of an oxide semiconductor material that can be used for the semiconductor layer 753 by sputtering. Note that the oxide semiconductor film may be formed in a rare gas atmosphere, an oxygen atmosphere, or a mixed atmosphere of a rare gas and oxygen. For example, by formation of the oxide semiconductor film in an oxygen atmosphere, a high-crystallinity oxide semiconductor film can be formed.

The oxide semiconductor film can be formed using an oxide target having a composition ratio of $In_2O_3:Ga_2O_3:ZnO=1:1:1$ (in a molar ratio) as a sputtering target. Alternatively, for example, the oxide semiconductor film may be formed using an oxide target having a composition ratio of $In_2O_3:Ga_2O_3:ZnO=1:1:2$ (in a molar ratio).

The proportion of the volume of a portion except for the area of a space and the like with respect to the total volume of the oxide target (such a proportion is also referred to as relative density) is preferably higher than or equal to 90% and lower than or equal to 100%, more preferably higher than or equal to 95% and lower than or equal to 99.9%. With the use of a metal oxide target with high relative density, the formed oxide semiconductor film has high density.

When the oxide semiconductor film is formed by sputtering, the substrate 750 may be kept under reduced pressure and heated at a temperature higher than or equal to 100° C. and lower than or equal to 600° C., preferably higher than or equal to 200° C. and lower than or equal to 400° C. By heating of the substrate 750, the impurity concentration in the oxide semiconductor film can be lowered and damage to the oxide semiconductor film caused by the sputtering can be reduced.

Figure 7A:
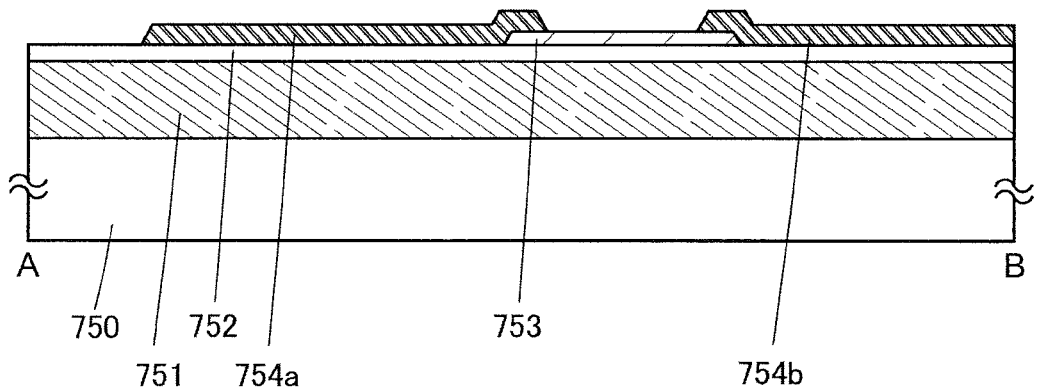
FIGS. 7A to 7C are schematic cross-sectional views illustrating an example of a method for manufacturing a memory device.

Then, as illustrated in FIG. 7A, a second conductive film is formed over the insulating layer 752 and the semiconductor layer 753 and is partly etched, so that the conductive layer 754a and the conductive layer 754b are formed.

For example, the second conductive film can be formed by formation of a film of any of the materials that can be used for the conductive layer 754a and the conductive layer 754b by sputtering or the like. Alternatively, the second conductive film can be a stack of films formed using the materials that can be used for the conductive layer 754a and the conductive layer 754b.

Figure 7B:
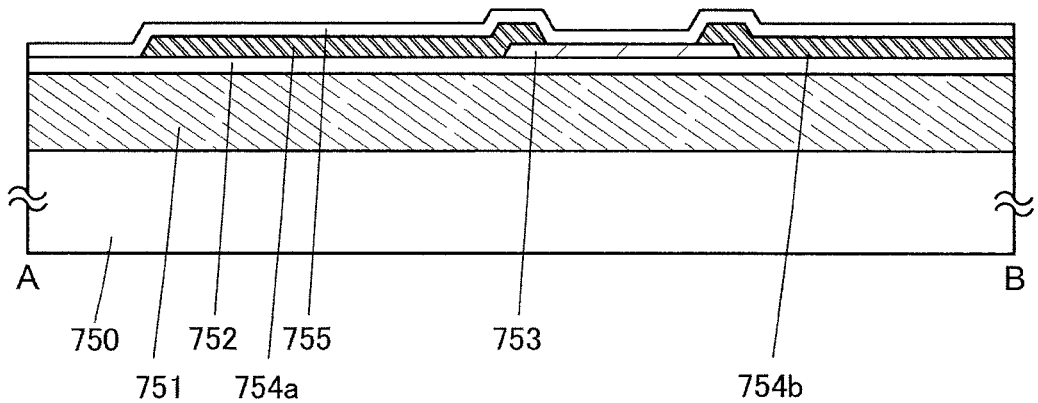

Then, as illustrated in FIG. 7B, the insulating layer 755 is formed over the insulating layer 752, the semiconductor layer 753, the conductive layer 754a, and the conductive layer 754b.

For example, the insulating layer 755 can be formed by a method similar to that used for the insulating layer 752.

Figure 7C:
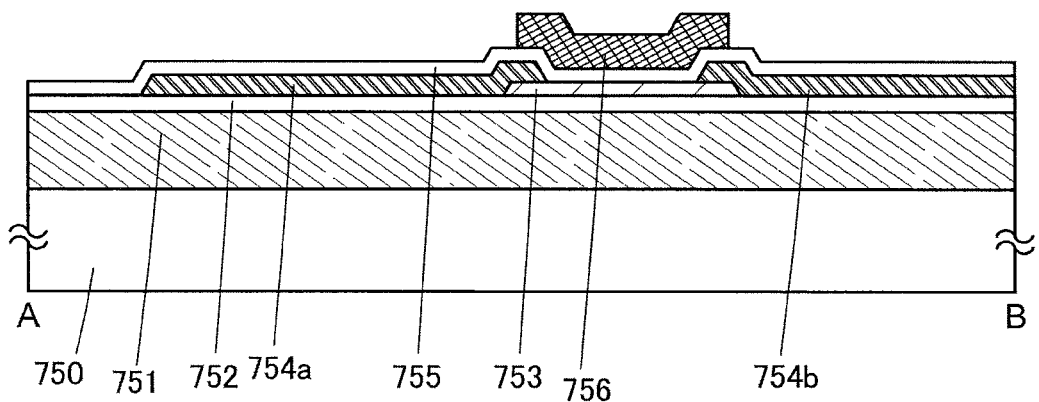

Then, as illustrated in FIG. 7C, a third conductive film is formed over the semiconductor layer 753 and is partly etched, so that the conductive layer 756 can be formed.

For example, the conductive layer 756 can be formed by a method similar to the method used for the conductive layer 751.

Figure 8A:
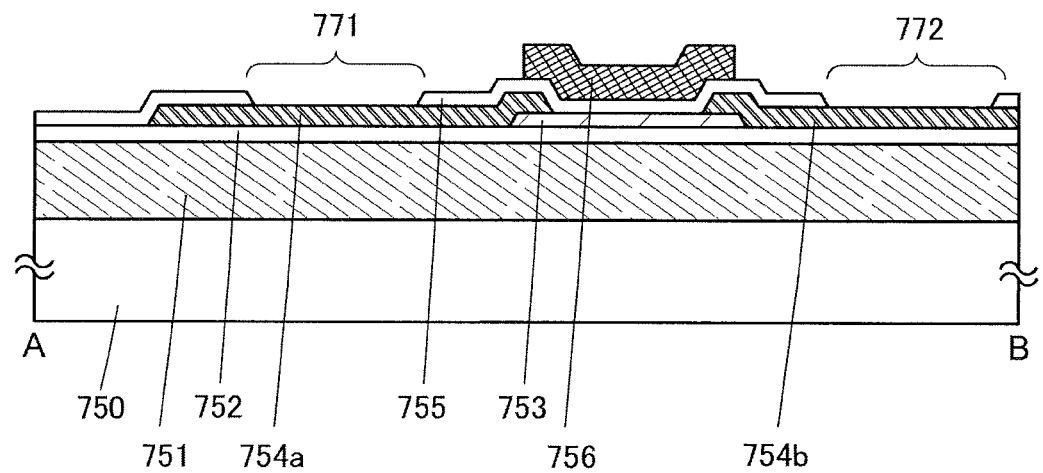
FIGS. 8A and 8B are schematic cross-sectional views illustrating an example of a method for manufacturing a memory device.

Then, as illustrated in FIG. 8A, the insulating layer 755 is partly etched, so that an opening portion 771 and an opening portion 772 are formed.

Figure 8B:
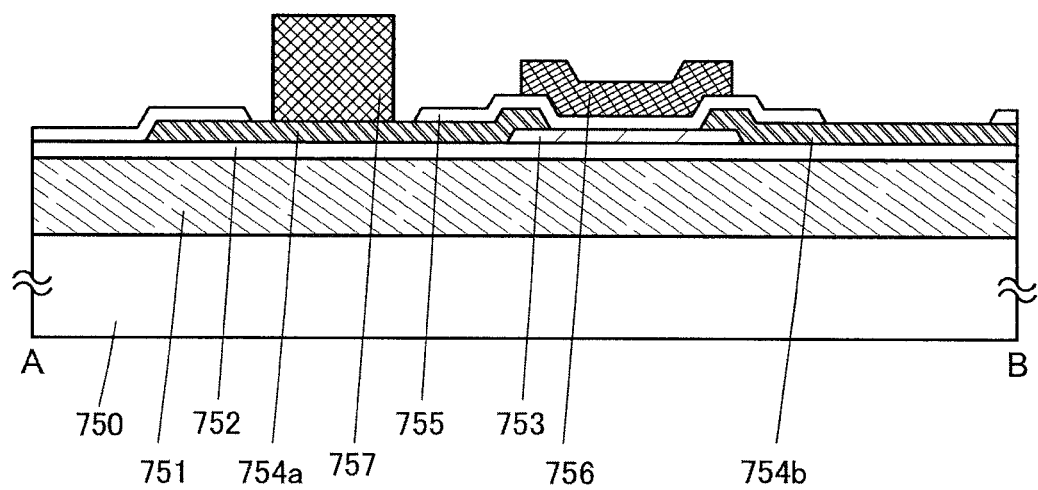

After that, as illustrated in FIG. 8B, a fourth conductive film is formed on the conductive layer 754a through the opening portion 771 and is partly etched, so that the conductive layer 757 is formed.

For example, the conductive layer 757 can be formed by a method similar to the method used for the conductive layer 751.

Figure 9A:
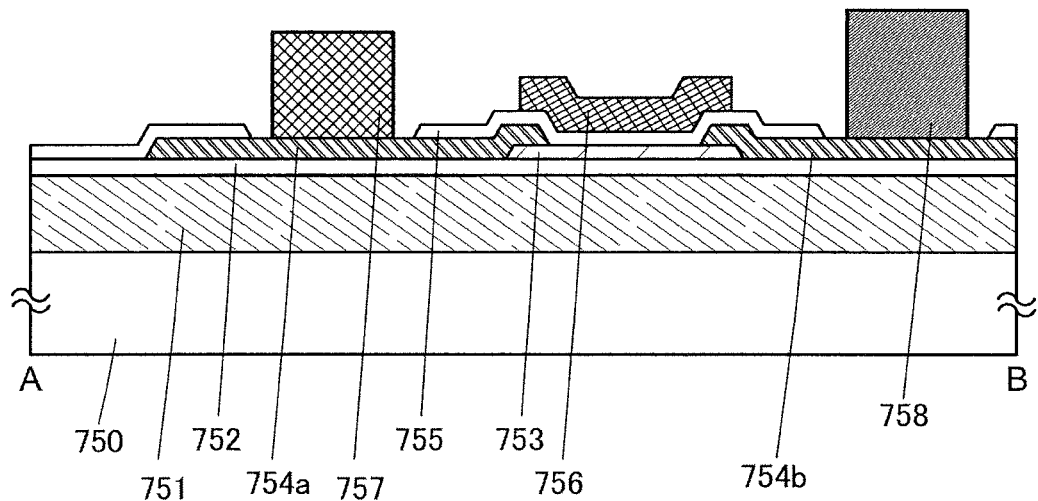
FIGS. 9A and 9B are schematic cross-sectional views illustrating an example of a method for manufacturing a memory device.

After that, as illustrated in FIG. 9A, a fifth conductive film is formed on the conductive layer 754b through the opening portion 772 and is partly etched, so that the conductive layer 758 is formed.

For example, the conductive layer 758 can be formed by a method similar to the method used for the conductive layer 751.

Note that the present invention is not limited thereto, and for example, it is possible that the conductive layer 757 and the conductive layer 758 are formed in the same step by partly etching the fourth conductive film with the use of a multi-tone mask.

Figure 9B:
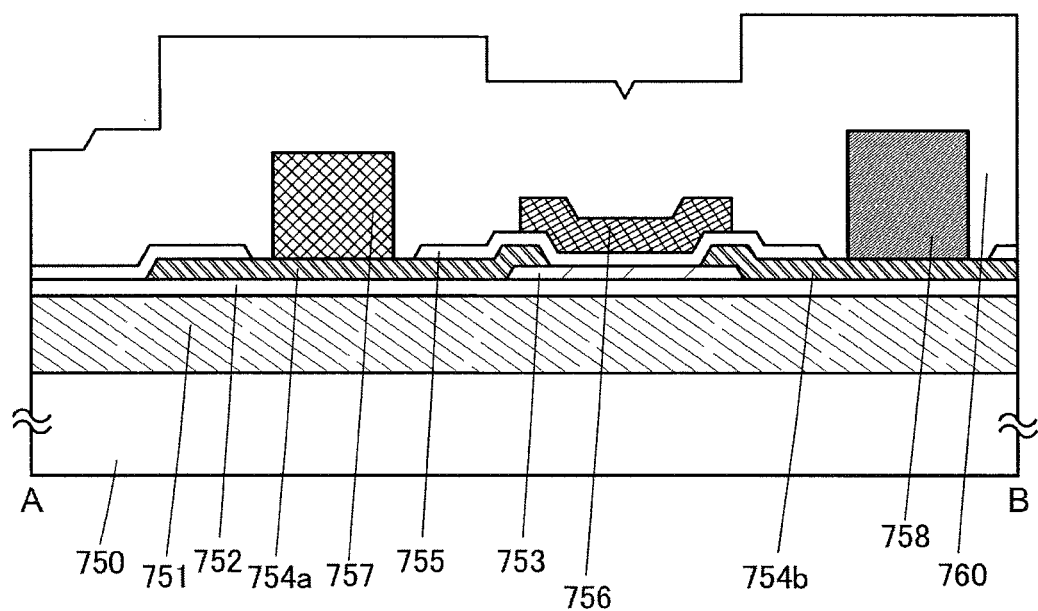

Then, as illustrated in FIG. 9B, the insulating layer 760 is foil led over the conductive layer 754a, the conductive layer 754b, the insulating layer 755, the conductive layer 756, the conductive layer 757, and the conductive layer 758.

For example, the insulating layer 760 can be formed by formation of a film of the material that can be used for the insulating layer 760 by a sputtering method or a CVD method.

Figure 10A:
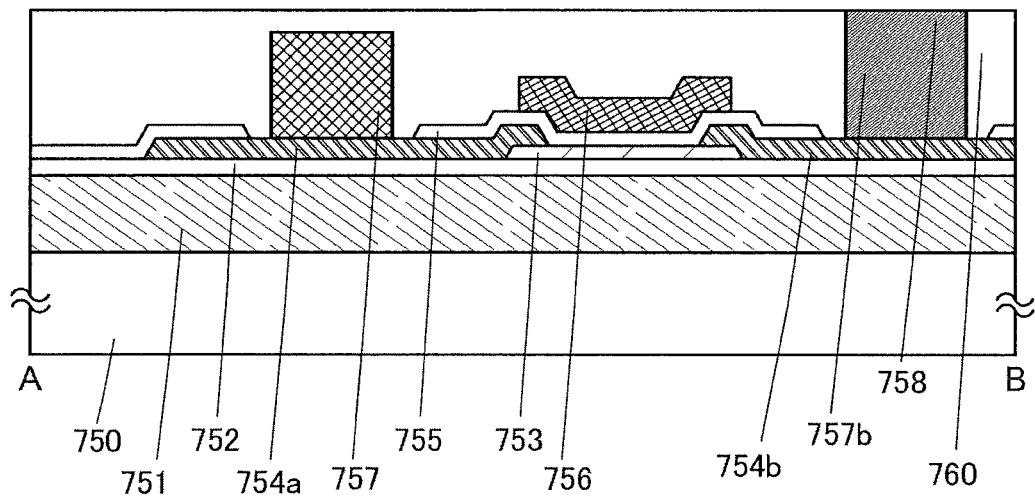
FIGS. 10A and 10B are schematic cross-sectional views illustrating an example of a method for manufacturing a memory device.

Then, as illustrated in FIG. 10A, an upper surface of the conductive layer 758 is exposed by removal of part of the insulating layer 760.

For example, the upper surface of the conductive layer 758 can be exposed by removal of the part of the insulating layer 760 by CMP (chemical mechanical polishing) or etching.

Figure 10B:
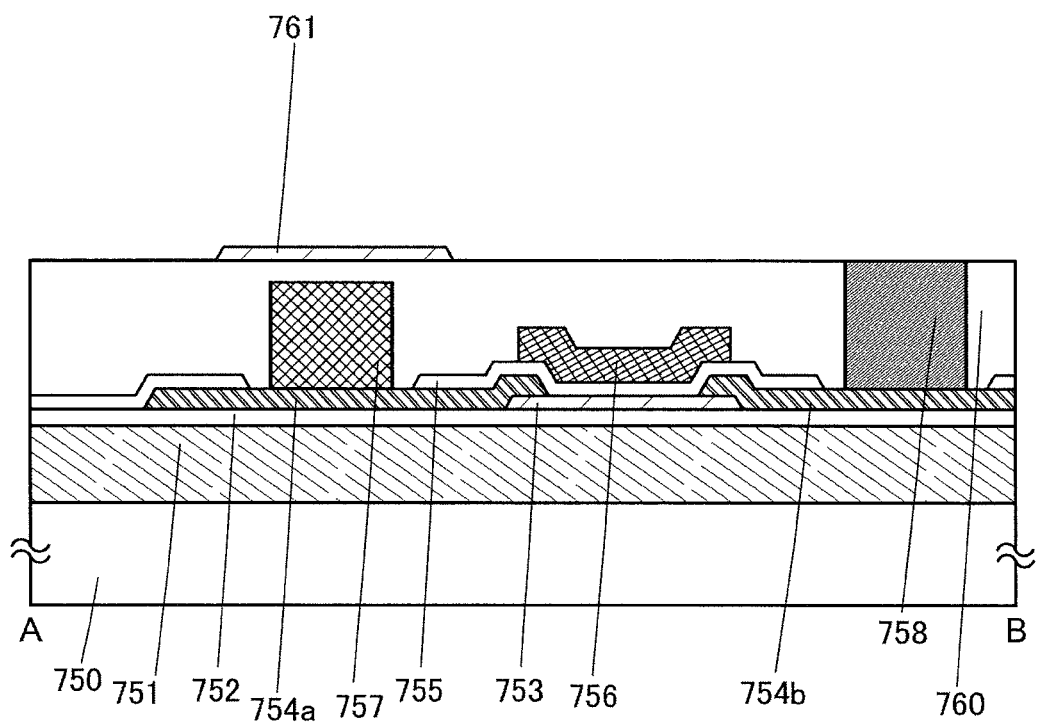

After that, as illustrated in FIG. 10B, the semiconductor layer 761 is formed over the conductive layer 757 with the insulating layer 760 interposed therebetween.

For example, the semiconductor layer 761 can be formed by a method similar to the method used for the semiconductor layer 753.

Figure 11A:
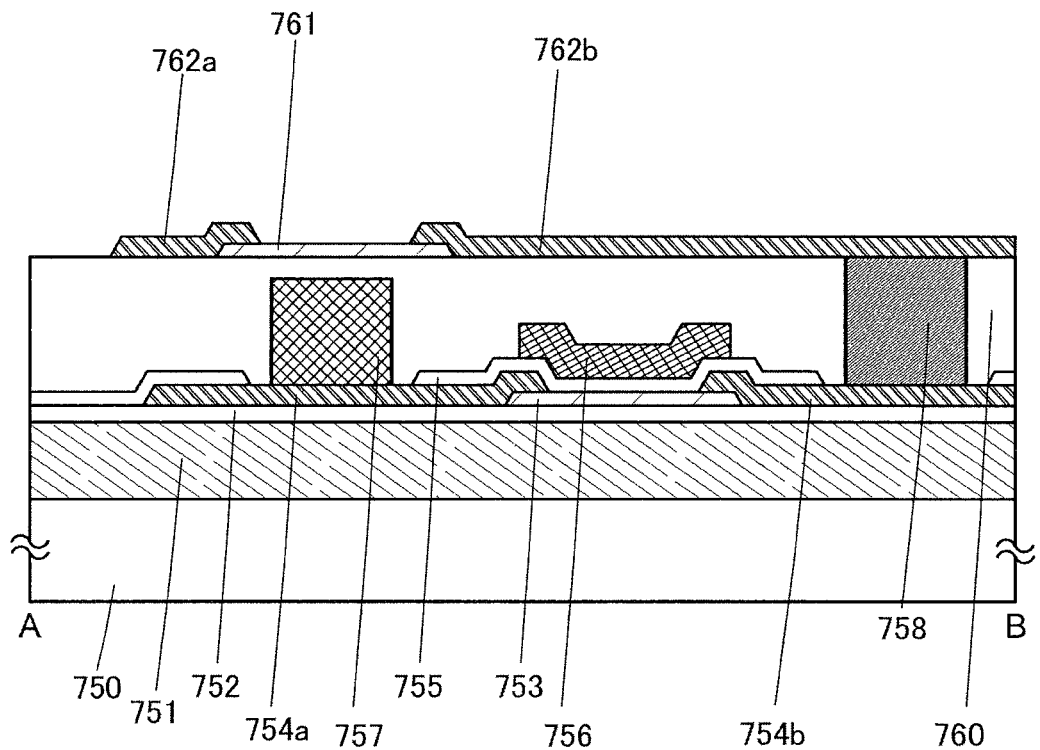
FIGS. 11A and 11B are schematic cross-sectional views illustrating an example of a method for manufacturing a memory device.

Then, as illustrated in FIG. 11A, a sixth conductive film is formed over the insulating layer 760 and the semiconductor layer 761 and is partly etched so that the conductive layer 762a and the conductive layer 762b are formed.

For example, the conductive layer 762a and the conductive layer 762b can be formed by a method similar to the method used for the conductive layer 754a and the conductive layer 754b.

Figure 11B:
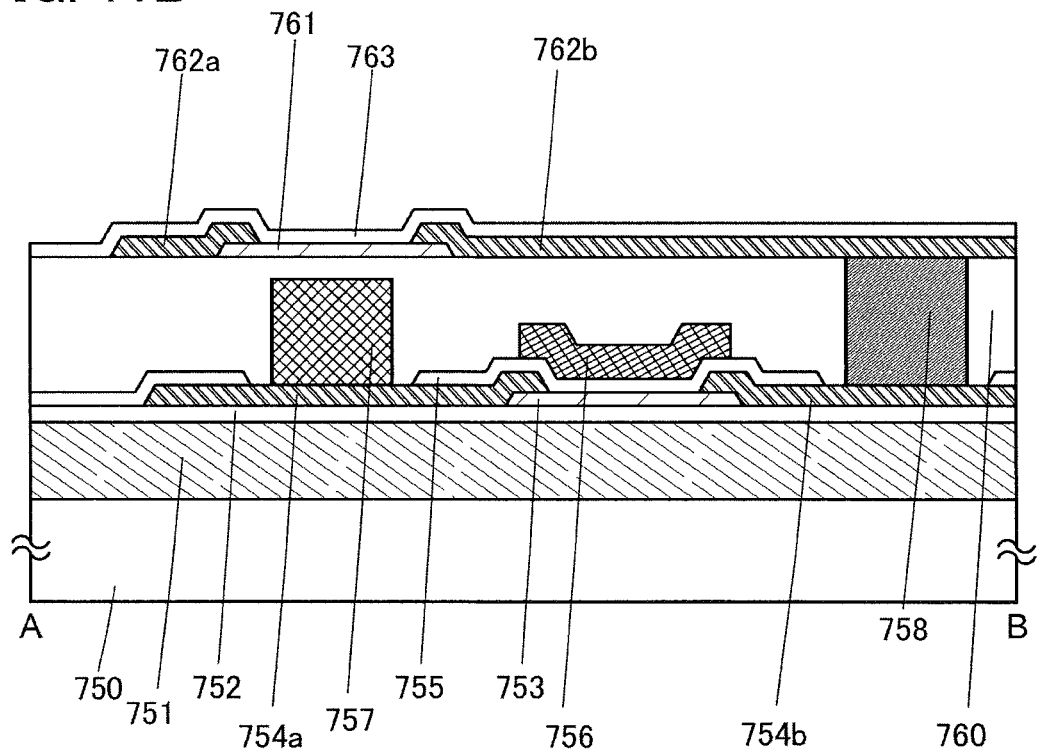

After that, as illustrated in FIG. 11B, the insulating layer 763 is formed over the semiconductor layer 761, the conductive layer 762a, and the conductive layer 762b.

For example, the insulating layer 763 can be formed by a method similar to the method used for the insulating layer 752.

Figure 12A:
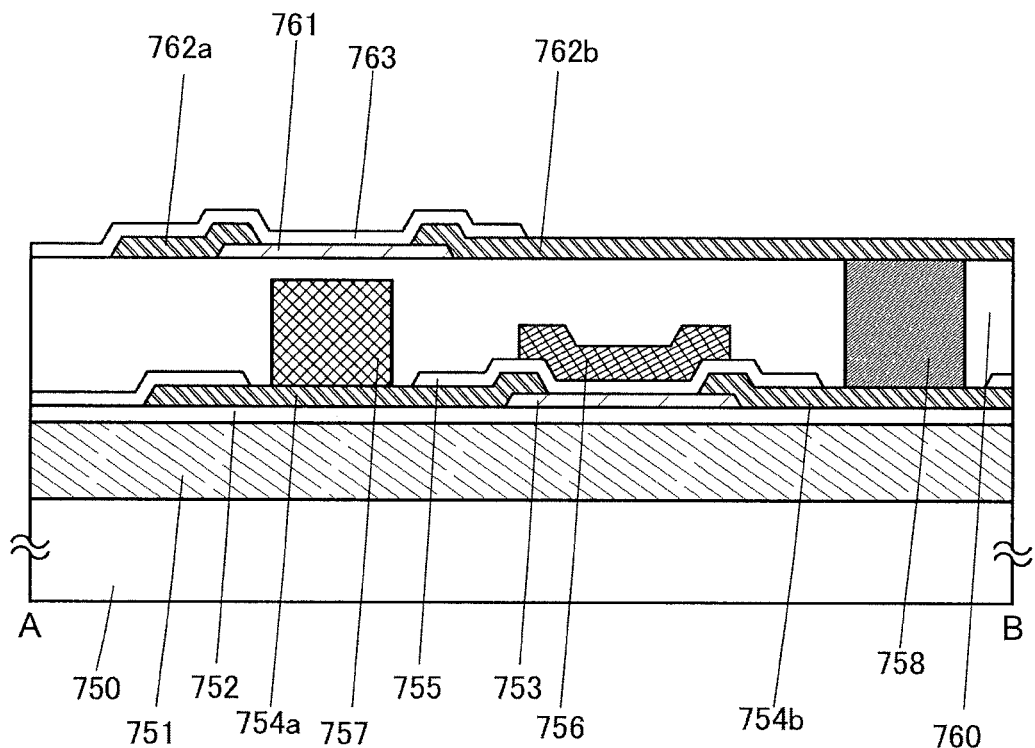
FIGS. 12A and 12B are schematic cross-sectional views illustrating an example of a method for manufacturing a memory device.

Then, as illustrated in FIG. 12A, an upper surface of the conductive layer 762b is exposed by etching part of the insulating layer 763.

Figure 12B:
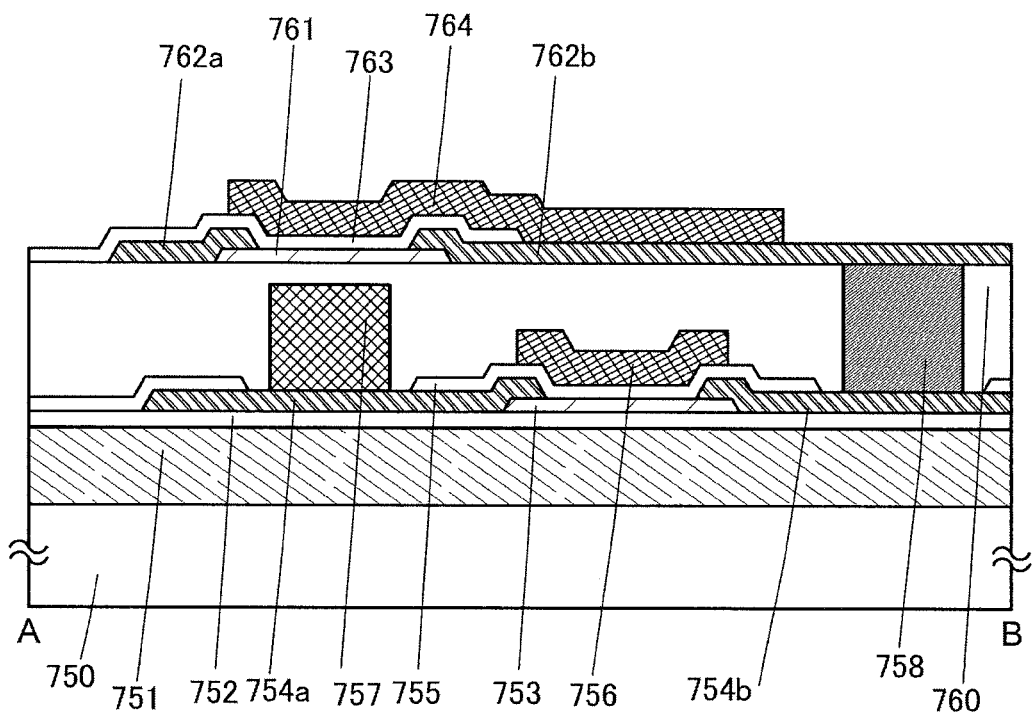

Then, as illustrated in FIG. 12B, a seventh conductive film is formed over the insulating layer 763 and the exposed conductive layer 762b and is partly etched so that the conductive layer 764 is formed.

For example, the conductive layer 764 can be formed by a method similar to the method used for the conductive layer 756.

Figure 13A:
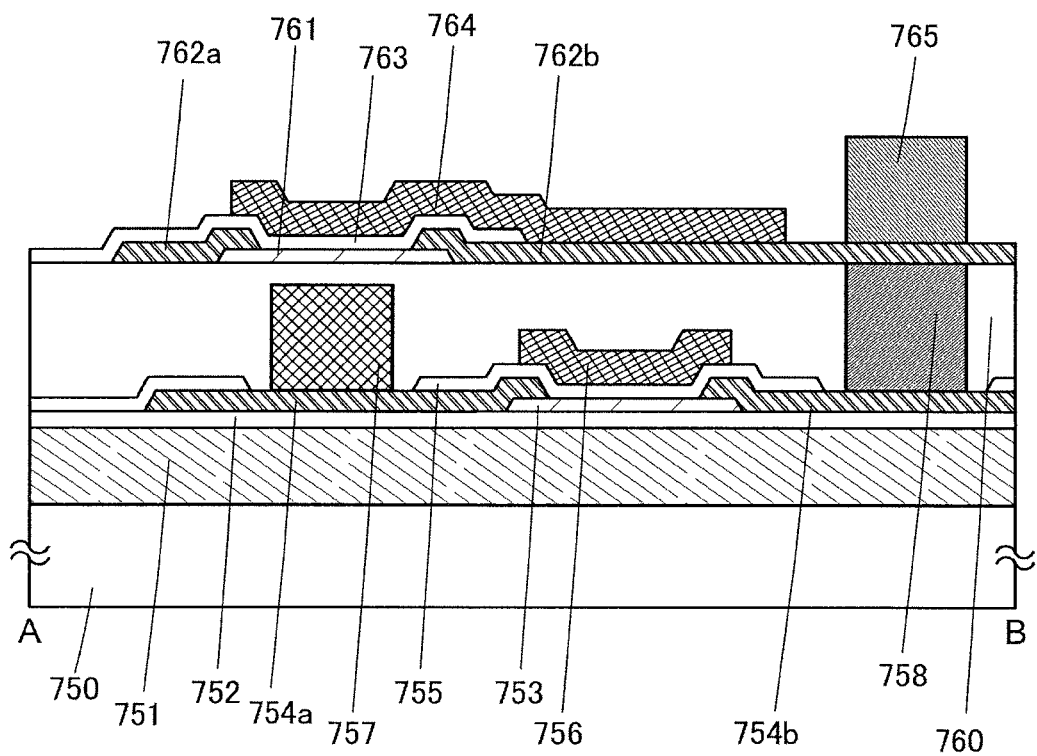
FIGS. 13A and 13B are schematic cross-sectional views illustrating an example of a method for manufacturing a memory device.

After that, as illustrated in FIG. 13A, an eighth conductive film is formed over the exposed conductive layer 762b and is partly etched, so that the conductive layer 765 is formed.

For example, the conductive layer 765 can be formed by a method similar to the method used for the conductive layer 757.

Figure 13B:
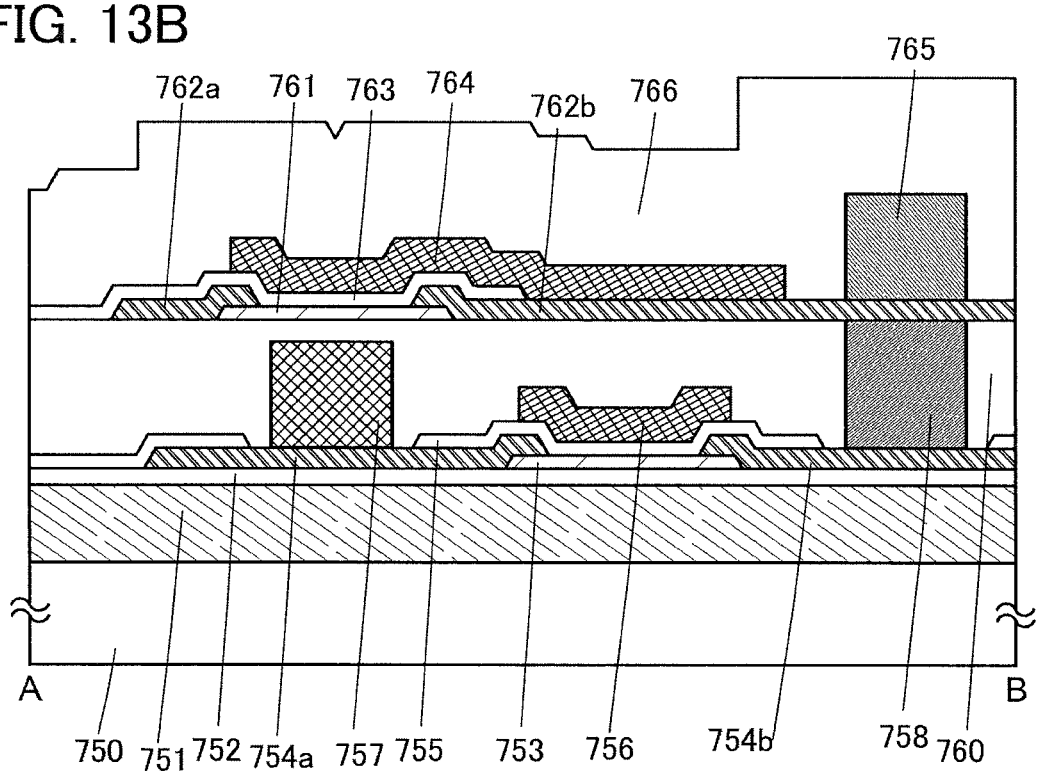

Then, as illustrated in FIG. 13B, the insulating layer 766 is formed over the conductive layer 762b, the insulating layer 763, the conductive layer 764, and the conductive layer 765.

For example, the insulating layer 766 can be formed by a method similar to the method used for the insulating layer 760.

Figure 14A:
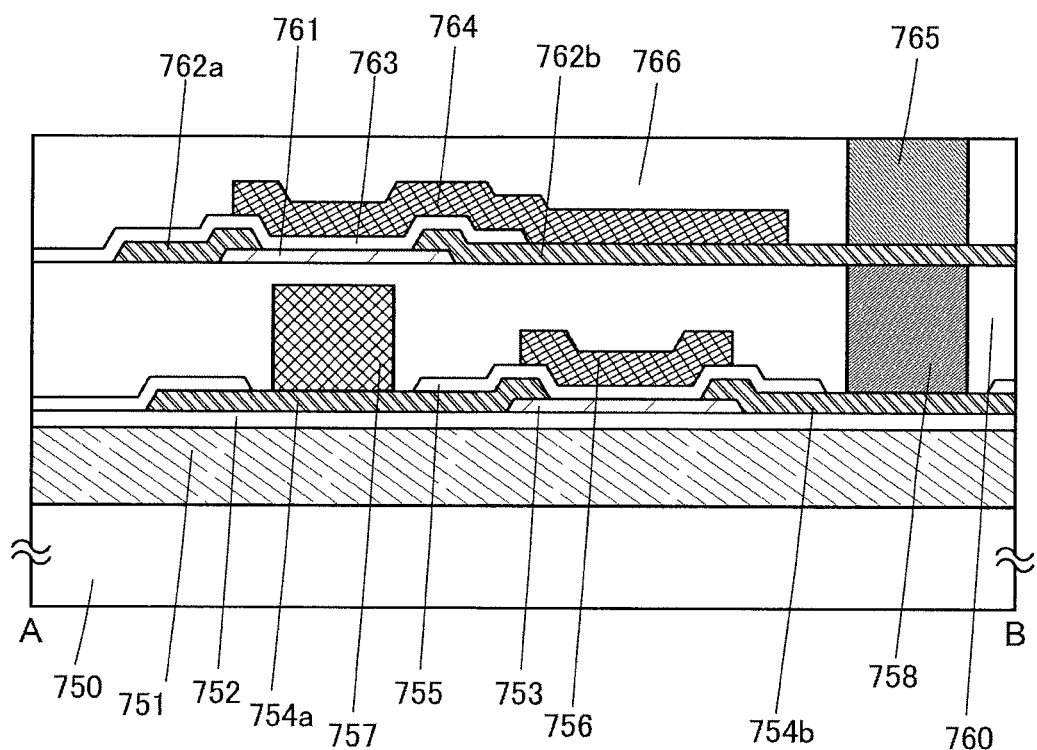
FIGS. 14A and 14B are schematic cross-sectional views illustrating an example of a method for manufacturing a memory device.

Then, as illustrated in FIG. 14A, an upper surface of the conductive layer 765 is exposed by removal of part of the insulating layer 766.

For example, the upper surface of the conductive layer 765 can be exposed by removal of the part of the insulating layer 766 by CMP (chemical mechanical polishing) or etching.

Figure 14B:
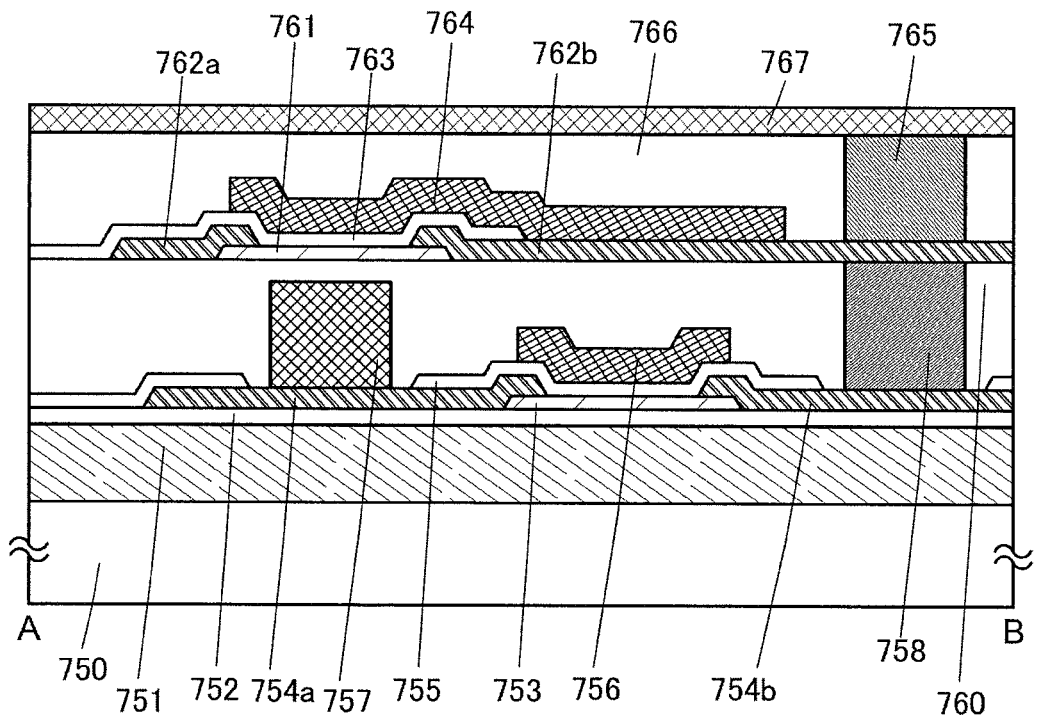

After that, as illustrated in FIG. 14B, a ninth conductive film is formed over the insulating layer 766 and the conductive layer 765 and is partly etched, so that the conductive layer 767 is formed.

For example, the conductive layer 767 can be formed by a method similar to the method used for the conductive layer 751.

In addition, in the example of the method for manufacturing the memory device illustrated in FIGS. 4A and 4B, heat treatment is performed at a temperature higher than or equal to 600° C. and lower than or equal to 750° C., or higher than or equal to 600° C. and lower than the strain point of the substrate, for example. Note that there is no particular limitation on timing of the above heat treatment as long as the heat treatment is performed after formation of the oxide semiconductor film. Furthermore, the heat treatment may be performed more than once.

Note that a heat treatment apparatus for the heat treatment can be an electric furnace or an apparatus for heating an object by heat conduction or heat radiation from a heater such as a resistance heater. For example, an RTA (rapid thermal annealing) apparatus such as a GRTA (gas rapid thermal annealing) apparatus, or an LRTA (lamp rapid thermal annealing) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus with which heat treatment is performed using a high-temperature gas. As the high-temperature gas, for example, a rare gas or an inert gas (e.g., nitrogen) which does not react with an object by heat treatment can be used.

After the heat treatment, a high-purity oxygen gas, a high-purity $N_2O$ gas, or ultra-dry air (with a dew point of −40° C. or lower, preferably −60° C. or lower) may be introduced into the furnace that has been used in the heat treatment while the heating temperature is maintained or decreased. In that case, it is preferable that water, hydrogen, and the like be not contained in the oxygen gas or the $N_2O$ gas. The purity of the oxygen gas or the $N_2O$ gas which is introduced into the heat treatment apparatus is preferably 6N or higher, more preferably 7N or higher. That is, the impurity concentration in the oxygen gas or the $N_2O$ gas is 1 ppm or lower, preferably 0.1 ppm or lower. By the action of the oxygen gas or the $N_2O$ gas, defects caused by oxygen deficiency in the semiconductor film can be reduced.

Further, in addition to the heat treatment, heat treatment (preferably at a temperature higher than or equal to 200° C. and lower than or equal to 600° C., for example, a temperature higher than or equal to 250° C. and lower than or equal to 350° C.) may be performed in an inert gas atmosphere or an oxygen gas atmosphere.

Through the above steps, the semiconductor layer 753 and the semiconductor layer 761 can be highly purified.

The above is description of the example of the method for manufacturing the memory cell illustrated in FIGS. 4A and 4B.

As described with reference to FIGS. 4A and 4B, FIG. 5, FIGS. 6A to 6C, FIGS. 7A to 7C, FIGS. 8A and 8B, FIGS. 9A and 9B, FIGS. 10A and 10B, FIGS. 11A and 11B, FIGS. 12A and 12B, FIGS. 13A and 13B, and FIGS. 14A and 14B, the memory cell in this embodiment has a structure in which a first field-effect transistor serving as a selection transistor and a second field-effect transistor serving as an output transistor are stacked.

Further, the memory cell in this embodiment has a structure in which the first field-effect transistor is provided over the second field-effect transistor.

With the above structure, the circuit area can be reduced.

Embodiment 4

In this embodiment, an example of a structure of a memory device is described.

Figure 15:
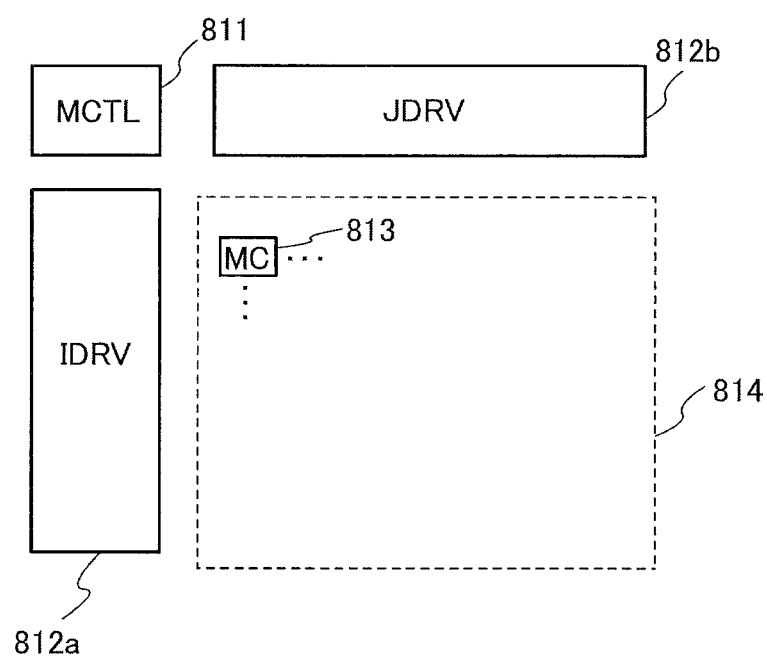
FIG. 15 illustrates an example of a structure of a memory device.

An example of a structure of a memory device in this embodiment is described with reference to FIG. 15. FIG. 15 is a block diagram illustrating an example of a structure of the semiconductor memory device in this embodiment.

The memory device illustrated in FIG. 15 includes a drive control circuit (also referred to as MCTL) 811, a driver circuit 812a (also referred to as an IDRV 812a), a driver circuit 812b (also referred to as a JDRV 812b), and a plurality of memory cells (also referred to as MC) 813.

A write control signal, a read control signal, and an address signal are input to the drive control circuit 811. The drive control circuit 811 generates and outputs a plurality of control signals in accordance with the input write control signal, read control signal, and address signal. For example, the drive control circuit 811 outputs a row address signal and a column address signal in accordance with the address signal input.

A row address signal is input to the driver circuit 812a. The driver circuit 812a selects a wiring (including, for example, a row selection line and a reading selection line) provided in the row direction in accordance with the row address signal input and sets the voltage of the wiring. The driver circuit 812a is provided with a first decoder, for example. The first decoder selects a wiring provided in the row direction in accordance with the row address signal input.

A data signal and a column address signal are input to the driver circuit 812b. The driver circuit 812b sets the voltage of a wiring (including, for example, a column selection line and a data line) provided in the column direction. The driver circuit 812b is provided with a second decoder and a plurality of analog switches, for example. The second decoder selects a wiring provided in the column direction and the plurality of analog switches determine whether or not the data signal is output in accordance with a signal input from the second decoder. Note that the driver circuit 812b may be provided with a read circuit. The read circuit reads data stored in the memory cell 813 electrically connected to a wiring that is selected.

The memory cell 813 is provided in a memory cell array 814. The structure of the memory device described in the above embodiment can be used as a structure of the memory cell 813. The memory cell 813 is selected by the driver circuit 812a and the driver circuit 812b, and data writing or data reading is performed in the selected memory cell 813.

In the memory device illustrated in FIG. 15, the memory cell is selected by the driver circuits in accordance with a signal input to the drive control circuit, and a write operation or a read operation is performed.

Figure 16A:
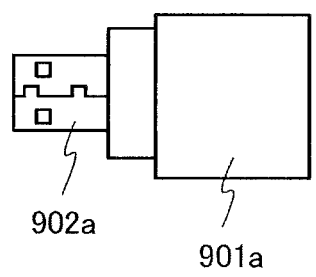
FIGS. 16A and 16B each illustrate an example of a memory device.
Figure 16B:
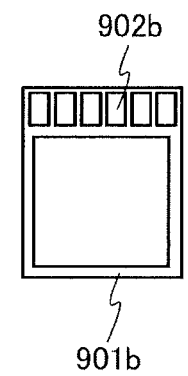

Further, an example of a memory device in this embodiment is described with reference to FIGS. 16A and 16B. FIGS. 16A and 16B are schematic views each illustrating an example of the memory device in this embodiment.

The memory device illustrated in FIG. 16A is also referred to as a universal serial bus (USB) memory. The memory device illustrated in FIG. 16A includes a housing 901a and a connector portion 902a.

The housing 901a includes, for example, the memory cell array, the driver circuit, and the drive control circuit which are illustrated in FIG. 15.

The connector portion 902a is electrically connected to the drive control circuit. The connector portion 902a is a terminal portion capable of being connected to a USB port of another electronic device.

When the memory device illustrated in FIG. 16A and another electronic device are electrically connected by inserting the connector portion 902a into a USB port of the electronic device, data from the electronic device can be written to the memory device or data can be read out of the memory device to the electronic device.

The memory device illustrated in FIG. 16B is a card-type memory device. The memory device illustrated in FIG. 16B includes a housing 901b and a connector portion 902b.

The housing 901b includes, for example, the memory cell array, the driver circuit, and the drive control circuit which are illustrated in FIG. 15.

The connector portion 902b is electrically connected to the drive control circuit. The connector portion 902b is a terminal portion capable of being connected to a card slot portion of another electronic device.

When the memory device illustrated in FIG. 16B and another electronic device are electrically connected by inserting the connector portion 902b into a card slot portion of the electronic device, data from the electronic device can be written to the memory device or data can be read out of the memory device to the electronic device.

When a structure of the memory device described in Embodiment 2 is employed as the structure of the memory device described with reference to FIGS. 16A and 16B, a memory device in which noise less influences a data signal can be formed.

Embodiment 5

In this embodiment, examples of electronic devices each including the memory device in the above embodiment are described.

Examples of structures of electronic devices in this embodiment are described with reference to FIGS. 17A to 17D.

Figure 17A:
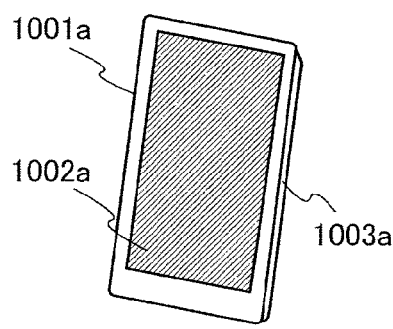
FIGS. 17A to 17D each illustrate an example of an electronic device.

The electronic device illustrated in FIG. 17A is an example of a personal digital assistant. The personal digital assistant illustrated in FIG. 17A includes a housing 1001*a* and a display portion 1002*a* provided in the housing 1001*a*.

Note that a side surface 1003*a* of the housing 1001*a* may be provided with a connection terminal for connecting the personal digital assistant to an external device and/or a button for operating the personal digital assistant illustrated in FIG. 17A.

The personal digital assistant illustrated in FIG. 17A includes a CPU, a memory circuit, an interface for transmitting and receiving a signal between the external device and each of the CPU and the memory circuit, and an antenna for transmitting and receiving a signal to and from the external device, in the housing 1001*a*.

The personal digital assistant illustrated in FIG. 17A serves as one or more of a telephone set, an e-book reader, a personal computer, and a game machine, for example.

Figure 17C:
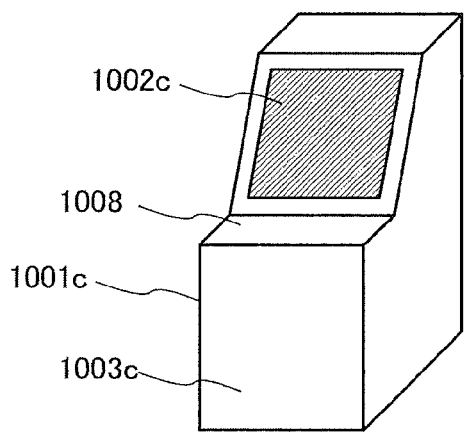
Figure 17B:
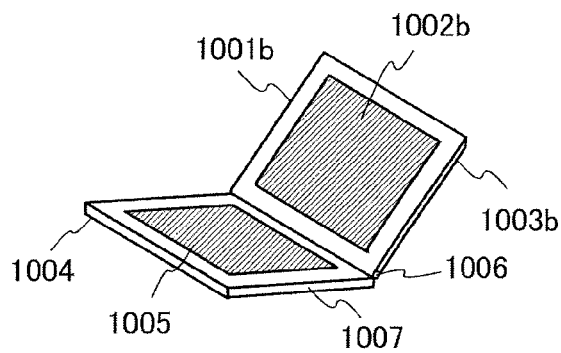

The electronic device illustrated in FIG. 17B is an example of a folding personal digital assistant. The personal digital assistant illustrated in FIG. 17B includes a housing 1001*b*, a display portion 1002*b* provided in the housing 1001*b*, a housing 1004, a display portion 1005 provided in the housing 1004, and a hinge 1006 for connecting the housing 1001*b* and the housing 1004.

In the personal digital assistant illustrated in FIG. 17B, the housing 1001*b* can be stacked on the housing 1004 by moving the housing 1001*b* or the housing 1004 with the hinge 1006.

Note that a side surface 1003*b* of the housing 1001*b* or a side surface 1007 of the housing 1004 may be provided with a connection terminal for connecting the personal digital assistant to an external device and/or a button for operating the personal digital assistant illustrated in FIG. 17B.

The display portion 1002*b* and the display portion 1005 may display different images or one image. Note that the display portion 1005 is not necessarily provided, and a keyboard which is an input device may be provided instead of the display portion 1005.

The personal digital assistant illustrated in FIG. 17B includes a CPU, a memory circuit, and an interface for transmitting and receiving a signal between the external device and each of the CPU and the memory circuit in the housing 1001*b* or the housing 1004. Note that the personal digital assistant illustrated in FIG. 17B may include an antenna for transmitting and receiving a signal to and from the external device.

The personal digital assistant illustrated in FIG. 17B serves as one or more of a telephone set, an e-book reader, a personal computer, and a game machine, for example.

The electronic device illustrated in FIG. 17C is an example of a stationary information terminal. The stationary information terminal illustrated in FIG. 17C includes a housing 1001*c* and a display portion 1002*c* provided in the housing 1001*c*.

Note that the display portion 1002*c* can be provided on a deck portion 1008 in the housing 1001*c*.

The stationary information terminal illustrated in FIG. 17C includes a CPU, a memory circuit, and an interface for transmitting and receiving a signal between the external device and each of the CPU and the memory circuit in the housing 1001*c*. Note that the stationary information terminal illustrated in FIG. 17C may include an antenna for transmitting and receiving a signal to and from the external device.

Further, a side surface 1003*c* of the housing 1001*c* in the stationary information terminal illustrated in FIG. 17C may be provided with one or more of a ticket output portion that outputs a ticket or the like, a coin slot, and a bill slot.

The stationary information terminal illustrated in FIG. 17C serves as an automated teller machine, an information communication terminal (also referred to as a multimedia station) for ordering a ticket or the like, or a game machine, for example.

Figure 17D:
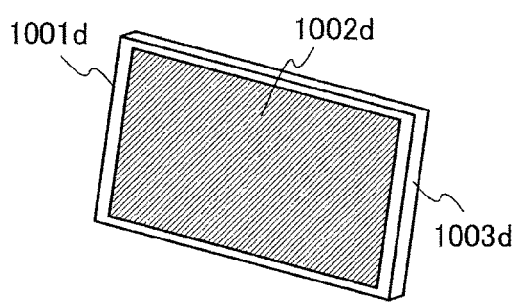

The electronic device illustrated in FIG. 17D is an example of a stationary information terminal. The stationary information terminal illustrated in FIG. 17D includes a housing 1001*d* and a display portion 1002*d* provided in the housing 1001*d*. Note that a support for supporting the housing 1001*d* may also be provided.

Note that a side surface 1003*d* of the housing 1001*d* may be provided with a connection terminal for connecting the stationary information terminal to an external device and/or a button for operating the stationary information terminal illustrated in FIG. 17D.

The stationary information terminal illustrated in FIG. 17D may include a CPU, a memory circuit, and an interface for transmitting and receiving a signal between the external device and each of the CPU and the memory circuit in the housing 1001*d*. Note that the stationary information terminal illustrated in FIG. 17D may include an antenna for transmitting and receiving a signal to and from the external device.

The stationary information terminal illustrated in FIG. 17D serves as a digital photo frame, a monitor, or a television set, for example.

The memory device in the above embodiment is used as one memory device in an electronic device, for example. For example, the memory device in the above embodiment is used as one of the memory devices in the electronic devices illustrated in FIGS. 17A to 17D. Note that the present invention is not limited thereto; it is possible to provide any of the electronic devices illustrated in FIGS. 17A to 17D with a memory device connection portion and to connect any of the memory devices illustrated in FIGS. 16A and 16B to the memory device connection portion, so that data can be written to or read from the memory device.

As described with reference to FIGS. 17A to 17D, the examples of the electronic devices in this embodiment each include a memory device which includes the memory device in the above embodiment.

With such a structure, even when power is not supplied, data in an electronic device can be retained for a certain period. Thus, reliability can be improved and power consumption can be reduced.

This application is based on Japanese Patent Application serial no. 2011-060175 filed with Japan Patent Office on Mar. 18, 2011, the entire contents of which are hereby incorporated by reference.

What is claimed is:
1. A semiconductor device comprising:
a first line;
a second line;
a third line; and
a first transistor and a second transistor each including a first gate, a second gate, a source, a drain, and a semiconductor layer, wherein the semiconductor layer of the first transistor is positioned between the first gate of the first transistor and the second gate of the first transistor,
wherein the semiconductor layer of the second transistor is positioned between the first gate of the second transistor and the second gate of the second transistor,
wherein the first gate of the first transistor is electrically connected to the first line,
wherein the second gate of the first transistor is electrically connected to the second line,
wherein one of the source and the drain of the first transistor is electrically connected to the third line,
wherein one of the source and the drain of the second transistor is electrically connected to the third line,
wherein the other of the source and the drain of the first transistor is electrically connected to the second gate of the second transistor,
wherein the semiconductor layer of the first transistor includes an oxide semiconductor,
wherein the semiconductor layer of the second transistor includes an oxide semiconductor,
wherein the first gate of the second transistor overlaps the semiconductor layer of the first transistor, and
wherein the semiconductor layer of the second transistor overlaps the other of the source and the drain of the first transistor.

2. The semiconductor device according to claim 1, further comprising a fourth line electrically connected to the other of the source and the drain of the second transistor.

3. The semiconductor device according to claim 1, wherein a material of the semiconductor layer of the first transistor is the same as a material of the semiconductor layer of the second transistor.

4. The semiconductor device according to claim 1, further comprising:
a fourth line;
a fifth line; and
a third transistor and a fourth transistor each including a first gate, a second gate, a source, a drain, and a semiconductor layer,
wherein the semiconductor layer of the third transistor is positioned between the first gate of the third transistor and the second gate of the third transistor,
wherein the semiconductor layer of the fourth transistor is positioned between the first gate of the fourth transistor and the second gate of the fourth transistor,
wherein the first gate of the third transistor is electrically connected to the first line,
wherein the second gate of the third transistor is electrically connected to the fourth line,
wherein one of the source and the drain of the third transistor is electrically connected to the fifth line,
wherein one of the source and the drain of the fourth transistor is electrically connected to the fifth line, and
wherein the other of the source and the drain of the third transistor is electrically connected to the second gate of the fourth transistor.

5. The semiconductor device according to claim 4, further comprising a sixth line electrically connected to the other of the source and the drain of the second transistor and the other of the source and the drain of the fourth transistor.

6. A semiconductor device comprising:
a first line;
a second line;
a third line; and a first transistor and a second transistor each including a first gate, a second gate, a source, a drain, and a semiconductor layer,
wherein the semiconductor layer of the first transistor is positioned between the first gate of the first transistor and the second gate of the first transistor,
wherein the semiconductor layer of the second transistor is positioned between the first gate of the second transistor and the second gate of the second transistor,
wherein the first gate of the first transistor is electrically connected to the first line,
wherein the second gate of the first transistor is electrically connected to the second line,
wherein one of the source and the drain of the first transistor is electrically connected to the third line,
wherein one of the source and the drain of the second transistor is electrically connected to the third line and the first gate of the second transistor,
wherein the other of the source and the drain of the first transistor is electrically connected to the second gate of the second transistor,
wherein the semiconductor layer of the first transistor includes an oxide semiconductor,
wherein the semiconductor layer of the second transistor includes an oxide semiconductor,
wherein the first gate of the second transistor overlaps the semiconductor layer of the first transistor, and
wherein the semiconductor layer of the second transistor overlaps the other of the source and the drain of the first transistor.

7. The semiconductor device according to claim 6, further comprising a fourth line electrically connected to the other of the source and the drain of the second transistor.

8. The semiconductor device according to claim 6, wherein a material of the semiconductor layer of the first transistor is the same as a material of the semiconductor layer of the second transistor.

9. The semiconductor device according to claim 6, further comprising:
a fourth line;
a fifth line; and
a third transistor and a fourth transistor each including a first gate, a second gate, a source, a drain, and a semiconductor layer,
wherein the semiconductor layer of the third transistor is positioned between the first gate of the third transistor and the second gate of the third transistor,
wherein the semiconductor layer of the fourth transistor is positioned between the first gate of the fourth transistor and the second gate of the fourth transistor,
wherein the first gate of the third transistor is electrically connected to the first line,
wherein the second gate of the third transistor is electrically connected to the fourth line,
wherein one of the source and the drain of the third transistor is electrically connected to the fifth line,
wherein one of the source and the drain of the fourth transistor is electrically connected to the fifth line and the first gate of the fourth transistor, and
wherein the other of the source and the drain of the third transistor is electrically connected to the second gate of the fourth transistor.

10. The semiconductor device according to claim 9, further comprising a sixth line electrically connected to the other of the source and the drain of the second transistor and the other of the source and the drain of the fourth transistor.

11. A semiconductor device comprising:
a first line;
a second line different from the first line;
a first transistor including a first gate, a second gate, a source, a drain, and a semiconductor layer; and
a second transistor including a first gate, a source, a drain, and a semiconductor layer,
wherein the semiconductor layer of the first transistor is positioned between the first gate of the first transistor and the second gate of the first transistor,
wherein the first gate of the first transistor is electrically connected to the first line,
wherein the second gate of the first transistor is electrically connected to one of the source and the drain of the second transistor,
wherein the first gate of the second transistor is electrically connected to the second line,
wherein the first gate of the first transistor overlaps the semiconductor layer of the second transistor,
wherein the first transistor is positioned over the second transistor, and wherein each of the semiconductor layer of the first transistor and the semiconductor layer of the second transistor comprises indium, zinc, and oxygen.

12. The semiconductor device according to claim 11, further comprising:
a third line electrically connected to one of the source and the drain of the first transistor; and
a fourth line,
wherein the second transistor further includes a second gate electrically connected to the fourth line,
wherein the other of the source and the drain of the first transistor is electrically connected to the second line, and
wherein one of the source and the drain of the second transistor is electrically connected to the second line.

13. The semiconductor device according to claim 11, wherein each of the semiconductor layer of the first transistor and the semiconductor layer of the second transistor further comprises gallium.

14. The semiconductor device according to claim 11, further comprising a capacitor electrically connected to the first transistor.

15. The semiconductor device according to claim 14,
wherein one electrode of the capacitor is electrically connected to the second gate of the first transistor, and
wherein the one electrode of the capacitor is electrically connected to the one of the source and the drain of the second transistor.

16. The semiconductor device according to claim 11,
wherein a material of the first gate of the second transistor is the same with a material of the second gate of the first transistor.

* * * * *